(12) United States Patent
Kondo et al.

(10) Patent No.: US 11,795,934 B2
(45) Date of Patent: Oct. 24, 2023

(54) PIEZOELECTRIC PUMP WITH AN UPPER AND LOWER VIBRATING BODY

(71) Applicant: Murata Manufacturing Co., Ltd., Kyoto (JP)

(72) Inventors: Daisuke Kondo, Kyoto (JP); Hiroaki Wada, Kyoto (JP); Nobuhira Tanaka, Kyoto (JP); Hiroyuki Yokoi, Kyoto (JP); Hiroki Achiwa, Kyoto (JP); Hiroshi Takemura, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 221 days.

(21) Appl. No.: 16/907,475

(22) Filed: Jun. 22, 2020

(65) Prior Publication Data
US 2020/0318630 A1 Oct. 8, 2020

Related U.S. Application Data

(63) Continuation of application No. PCT/JP2018/044598, filed on Dec. 4, 2018.

(30) Foreign Application Priority Data

Dec. 22, 2017 (JP) ................................ 2017-246689

(51) Int. Cl.
*F04B 45/10* (2006.01)
*F04B 43/04* (2006.01)
(Continued)

(52) U.S. Cl.
CPC ............ *F04B 45/10* (2013.01); *F04B 43/046* (2013.01); *F04B 45/047* (2013.01); *H10N 30/2047* (2023.02)

(58) Field of Classification Search
CPC .... F04B 43/046; F04B 43/043; F04B 45/047; F04B 53/16; F04B 45/10; H01N 30/2047
(Continued)

(56) References Cited

U.S. PATENT DOCUMENTS

2011/0076170 A1 3/2011 Fujisaki et al.
2014/0178220 A1 6/2014 Fujisaki et al.
(Continued)

FOREIGN PATENT DOCUMENTS

CN 102046978 A 5/2011
GB 2542527 A 3/2017
(Continued)

OTHER PUBLICATIONS

Machine Translation of WO 2016063711 A1 to Tanaka, retrieved from espacenet on Jul. 9, 2022 (Year: 2022).*
(Continued)

*Primary Examiner* — Philip E Stimpert
*Assistant Examiner* — Dnyanesh G Kasture
(74) *Attorney, Agent, or Firm* — Pearne & Gordon LLP

(57) ABSTRACT

A pump includes a housing, a first vibrating body, a second vibrating body, and a peripheral wall portion that define a pump chamber, and a driving body. The housing has a first wall portion opposed to the first vibrating body and a second wall portion. The first wall portion includes a first concave portion that opens toward the first vibrating body and opposed to a central portion of the first vibrating body and a first circumferential portion adjacent to the first concave portion. A first chamber includes a first wide portion defined by the first concave portion and the first vibrating body, and a first narrow portion defined by the first circumferential portion and the first vibrating body. The first narrow portion overlaps with at least part of the first vibrating body.

20 Claims, 15 Drawing Sheets

(51) Int. Cl.
    *F04B 45/047*     (2006.01)
    *H10N 30/20*     (2023.01)

(58) Field of Classification Search
    USPC ............... 417/410.1, 413.1, 413.2, 540–542
    See application file for complete search history.

(56) References Cited

U.S. PATENT DOCUMENTS

| | | |
|---|---|---|
| 2016/0076530 A1 | 3/2016 | Chen et al. |
| 2016/0348666 A1 | 12/2016 | Tanaka |
| 2017/0138357 A1 | 5/2017 | Kondo et al. |
| 2018/0240733 A1* | 8/2018 | Chen ................. H05K 7/20127 |
| 2019/0056367 A1* | 2/2019 | Mou ...................... H05K 5/065 |

FOREIGN PATENT DOCUMENTS

| | | | | |
|---|---|---|---|---|
| JP | 5692468 | B2 | 4/2015 | |
| JP | WO 2016063711 A1 * | | 4/2016 | ......... F16K 99/0015 |
| WO | 2009148008 | A1 | 12/2009 | |
| WO | 2014024608 | A1 | 2/2014 | |
| WO | 2015125608 | A1 | 8/2015 | |
| WO | 2016009870 | A1 | 1/2016 | |

OTHER PUBLICATIONS

Office Action for Chinese Patent Application No. 201880081902.9 dated Jul. 27, 2021.
International Search Report issued in Application No. PCT/JP2018/044598, dated Feb. 5, 2019.
Written Opinion issued in Application No. PCT/JP2018/044598, dated Feb. 5, 2019.

\* cited by examiner

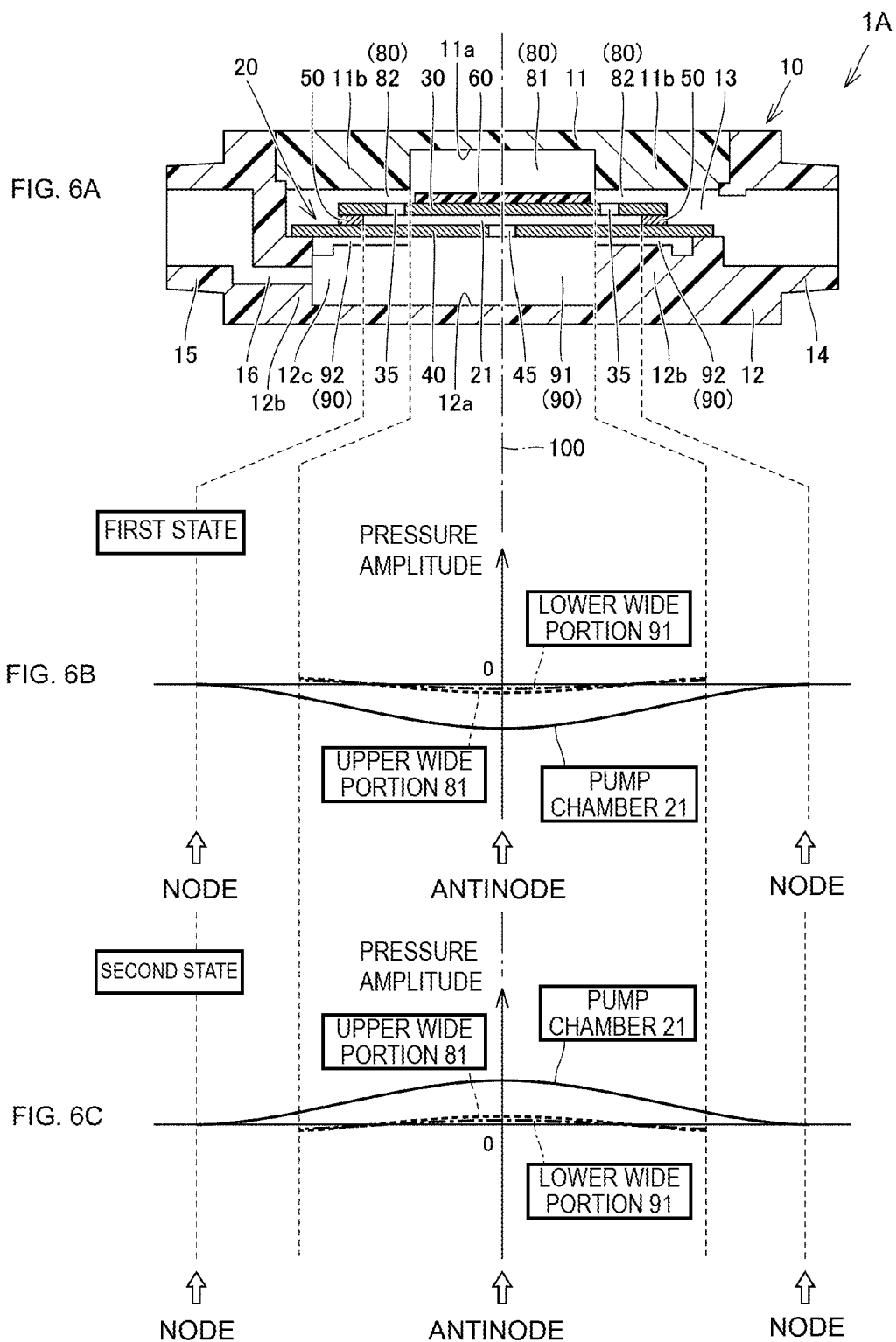

DIAMETER RATIO OF LOWER WIDE
PORTION TO LOWER VIBRATING BODY
[-]

PIEZOELECTRIC PUMP WITH AN UPPER AND LOWER VIBRATING BODY

This is a continuation of International Application No. PCT/JP2018/044598 filed on Dec. 4, 2018 which claims priority from Japanese Patent Application No. 2017-246689 filed on Dec. 22, 2017. The contents of these applications are incorporated herein by reference in their entireties.

BACKGROUND

Technical Field

The present disclosure relates to a positive-displacement pump using a flexural vibration of a plate-like vibrating body, and particularly to a piezoelectric pump using a piezoelectric element as a driving body for driving a vibrating body.

A piezoelectric pump that is a type of a positive-displacement pump has been known. A piezoelectric pump is configured by defining at least part of a pump chamber by a vibrating plate to which a piezoelectric element is attached, and an AC voltage having a predetermined frequency is applied to the piezoelectric element to drive the vibrating plate at a resonant frequency, thereby generating pressure fluctuation in the pump chamber to enable suction and discharge of fluid.

For example, International Publication No. WO 2015/125608 (Patent Document 1) is a document in which a configuration example of a piezoelectric pump is disclosed. In the piezoelectric pump disclosed in the publication, a configuration is adopted in which a pump chamber is defined by a pair of vibrating plates opposed, and a piezoelectric element is attached to one vibrating plate of the pair.

In the piezoelectric pump disclosed in the above publication, one hole portion to which a check valve is attached is provided in a central portion of another vibrating plate, to which a piezoelectric element is not attached, of the pair, and hole portions which are disposed in sequence in an annular shape and to which a check valve is not attached are provided in the vicinity of a peripheral portion of the vibrating plate, to which the piezoelectric element is attached, of the pair.

In the piezoelectric pump having such configuration, the piezoelectric element causes the vibrating plates forming the pair to bend and vibrate so as to be displaced in opposite directions, thereby pressure fluctuation being generated in a pump chamber, and along with the pressure fluctuation in the pump chamber, fluid positioned outside the pump chamber is pulled in from the hole portions provided in the vibrating plate to which the piezoelectric element is attached, and subsequently the fluid is discharged from the one hole portion provided in the vibrating plate to which a piezoelectric element is not attached, thus a pump function is exerted.

Note that, the check valve attached to the one hole portion provided in the vibrating plate to which a piezoelectric element is not attached determines a direction of a fluid flow occurring in the piezoelectric pump, and passively opens and closes in accordance with the pressure fluctuation in the pump chamber.

Patent Document 1: International Publication No. WO 2015/125608

BRIEF SUMMARY

In general, a piezoelectric pump is often configured, as described above, by installing, inside a housing, a driving unit including a vibrating plate and a piezoelectric element. Such configuration is employed to protect the driving unit from an outside and to facilitate connection of the piezoelectric pump to external piping, equipment, or the like.

In the piezoelectric pump including the above housing, since a wall portion of the housing is disposed so as to be opposed to the vibrating plate, pressure fluctuation occurs to a considerable extent during operation of the piezoelectric pump in a space formed between the vibrating plate and the wall portion of the housing (that is, a space outside the pump chamber) as well. The pressure fluctuation occurring in the space outside the pump chamber applies force to the vibrating plate in a direction interrupting displacement due to vibration of the vibrating plate and, as a result, a compression ratio in the pump chamber decreases, and deterioration in performance as a piezoelectric pump (that is, a decrease in flow rate, a decrease in suction pressure and discharge pressure, and the like) is caused.

In order to prevent the above situation, it is effective to enlarge the space outside the pump chamber (that is, to increase a distance between the wall portion of the housing and the vibrating plate), but when the space is enlarged without necessarily any contrivance, the piezoelectric pump may increase in size as a whole, pressure resonance may occur in the space, and thus performance of the piezoelectric pump may be less likely to be improved effectively.

The present disclosure improves pump performance in comparison with the related art without necessarily increasing the size of a device in a positive-displacement pump using flexural vibration of a plate-like vibrating body.

A pump based on the present disclosure includes a first vibrating body, a second vibrating body, a peripheral wall portion, a pump chamber, a driving body, and a housing. The first vibrating body and the second vibrating body are both plate-shaped, and the second vibrating body is opposed to the first vibrating body. The peripheral wall portion connects a peripheral portion of the first vibrating body with a peripheral portion of the second vibrating body. The pump chamber is positioned between the first vibrating body and the second vibrating body, and is defined by the first vibrating body, the second vibrating body, and the peripheral wall portion. The driving body causes the first vibrating body and the second vibrating body to bend and vibrate to generate pressure fluctuation in the pump chamber. The housing houses a driving unit composed of the first vibrating body, the second vibrating body, the peripheral wall portion, and the driving body. The housing has a first wall portion positioned on a side opposite to a side where the second vibrating body is positioned when viewed from the first vibrating body, and a second wall portion positioned on a side opposite to a side where the first vibrating body is positioned when viewed from the second vibrating body. The driving unit is disposed so as to divide a space inside the housing into a first chamber defined by the first vibrating body and the first wall portion, and a second chamber defined by the second vibrating body and the second wall portion. The housing is provided with a first communication portion for communicating the first chamber with a space outside the housing, and a second communication portion for communicating the second chamber with a space outside the housing. The first vibrating body is provided with a first hole portion for communicating the pump chamber with the first chamber, and the second vibrating body is provided with a second hole portion for communicating the pump chamber with the second chamber. The first wall portion includes a first concave portion that opens toward the first vibrating body and that is opposed to a portion, including a central portion, of the first vibrating body, and a first circumferential portion that is adjacent to the first concave portion in a direction orthogonal to an axis line orthogonal to the central portion of the first vibrating body and a central portion of the second vibrating body. The first chamber includes a first wide portion defined by the first concave portion and a portion of the first vibrating body opposed to the first concave portion, and a first narrow portion defined by the first circumferential portion and a portion of the first vibrating body opposed to the first circumferential portion. The first narrow portion overlaps with at least part of the first vibrating body in a direction parallel to an extending direction of the axis line.

In the pump based on the present disclosure, the first vibrating body can be disk-shaped, and the first wide portion can be formed of a cylindrical space.

In the pump based on the present disclosure, when a diameter of the first vibrating body is Ra1 and a diameter of the first wide portion is Rb1, a condition of $0.4 \leq Rb1/Ra1 < 1.0$ can be satisfied.

In the pump based on the present disclosure, the first wide portion can be positioned such that a central axis thereof and the axis line coincide with each other.

In the pump based on the present disclosure, two or more first hole portions, each of which is the first hole portion described above, may be provided, and in that case, the two or more first hole portions can be, when viewed along the extending direction of the axis line, disposed in sequence at positions on a circumference about the axis line.

In the pump based on the present disclosure, the two or more first hole portions may be disposed so as to be opposed to the first circumferential portion.

In the pump based on the present disclosure, the first communication portion can be disposed at a position that does not overlap with the first vibrating body in the direction parallel to the extending direction of the axis line.

In the pump based on the present disclosure, the second wall portion may include a second concave portion that opens toward the second vibrating body and that is opposed to a portion, including the central portion, of the second vibrating body, and a second circumferential portion adjacent to the second concave portion in a direction orthogonal to the axis line. In this case, the second chamber can include a second wide portion defined by the second concave portion and a portion of the second vibrating body opposed to the second concave portion, and a second narrow portion defined by the second circumferential portion and a portion of the second vibrating body opposed to the second circumferential portion, and in that case, the second narrow portion can overlap with at least part of the second vibrating body in the direction parallel to the extending direction of the axis line.

In the pump based on the present disclosure, the second vibrating body can be disk-shaped, and the second wide portion can be formed of a cylindrical space.

In the pump based on the present disclosure, when a diameter of the second vibrating body is Ra2 and a diameter of the second wide portion is Rb2, a condition of $0.4 \leq Rb2/Ra2 < 1.0$ can be satisfied.

In the pump based on the present disclosure, the second wide portion can be positioned such that a central axis thereof and the axis line coincide with each other.

In the pump based on the present disclosure, one or more second hole portions, each of which is the second hole portion described above, may be provided, and in that case, the one or more second hole portions can be disposed at or close to the central portion of the second vibrating body.

The pump based on the present disclosure may further include an orifice that is provided at a position not overlapping with the second vibrating body in the direction parallel to the extending direction of the axis line, and that forms at least part of a flow path that communicates the second wide portion with the second communication portion, and in that case, the second wide portion may be configured to communicate with the second communication portion only through the orifice.

In the pump based on the present disclosure, the second communication portion can be disposed at a position that does not overlap with the second vibrating body in the direction parallel to the extending direction of the axis line.

In the pump based on the present disclosure, the driving body can cause the first vibrating body and the second vibrating body to bend and vibrate such that standing waves occur in both the first vibrating body and the second vibrating body about the axis line.

In the pump based on the present disclosure, the first communication portion can function as a suction portion for pulling in fluid from a space outside the housing to the first chamber, and the second communication portion can function as a discharge portion for discharging fluid from the second chamber to a space outside the housing.

In the pump based on the present disclosure, the driving body can include a piezoelectric element in a flat shape attached to one of the first vibrating body and the second vibrating body.

According to the present disclosure, in a positive-displacement pump utilizing flexural vibration of a plate-like vibrating body, pump performance can be improved compared to the related art without necessarily increasing the size of a device.

BRIEF DESCRIPTION OF THE SEVERAL VIEWS OF THE DRAWINGS

FIGS. 6A, 6B, and 6C are schematic diagrams illustrating pressure fluctuation occurring in a pump chamber, an upper wide portion, and a lower wide portion of the piezoelectric blower illustrated in FIG. 1.

DETAILED DESCRIPTION

Figure 1:
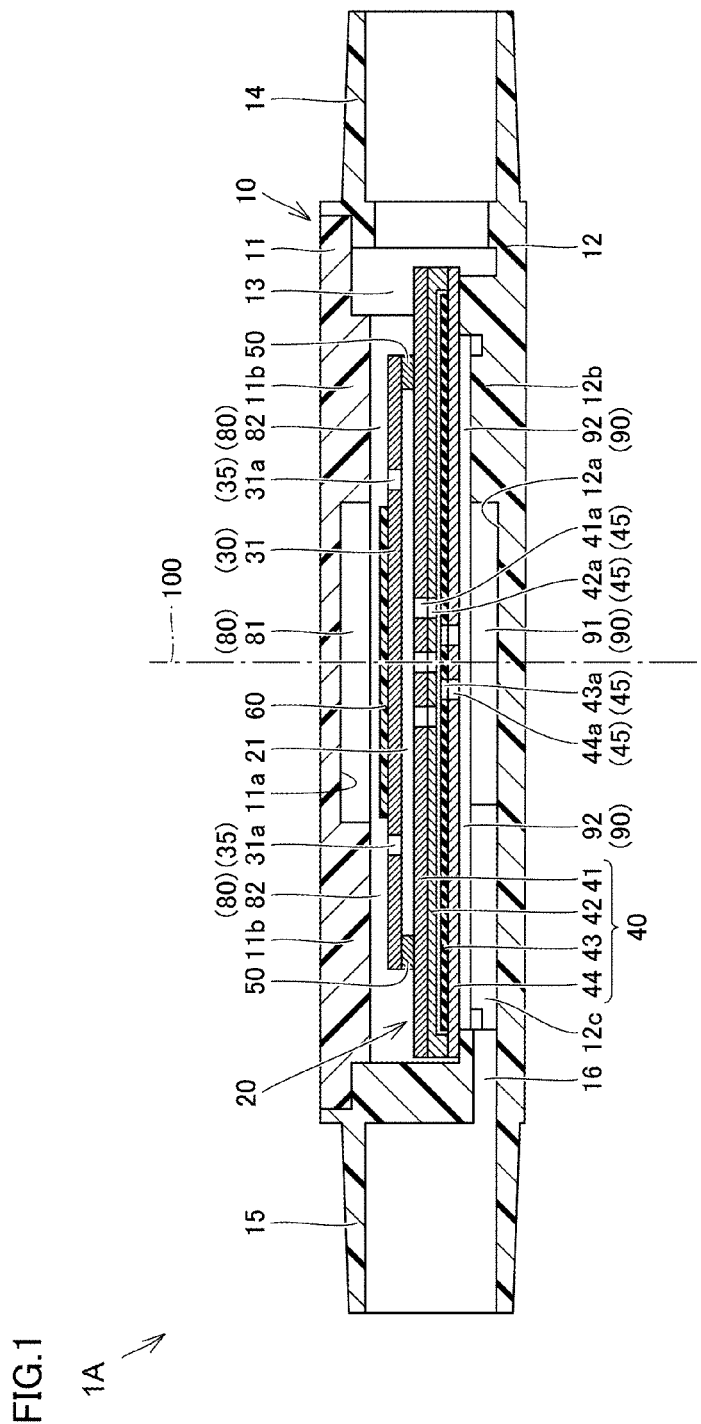
FIG. 1 is a schematic sectional view of a piezoelectric blower according to Embodiment 1.

Hereinafter, embodiments of the present disclosure will be described in detail with reference to the drawings. Each of the embodiments described below illustrates a case in which the present disclosure is applied to a piezoelectric blower as a pump for pulling in and discharging gas. Note that, in the following embodiments, the same or common components are assigned the same reference numerals in the drawings, and description thereof is not repeated.

Embodiment 1

Figure 2:
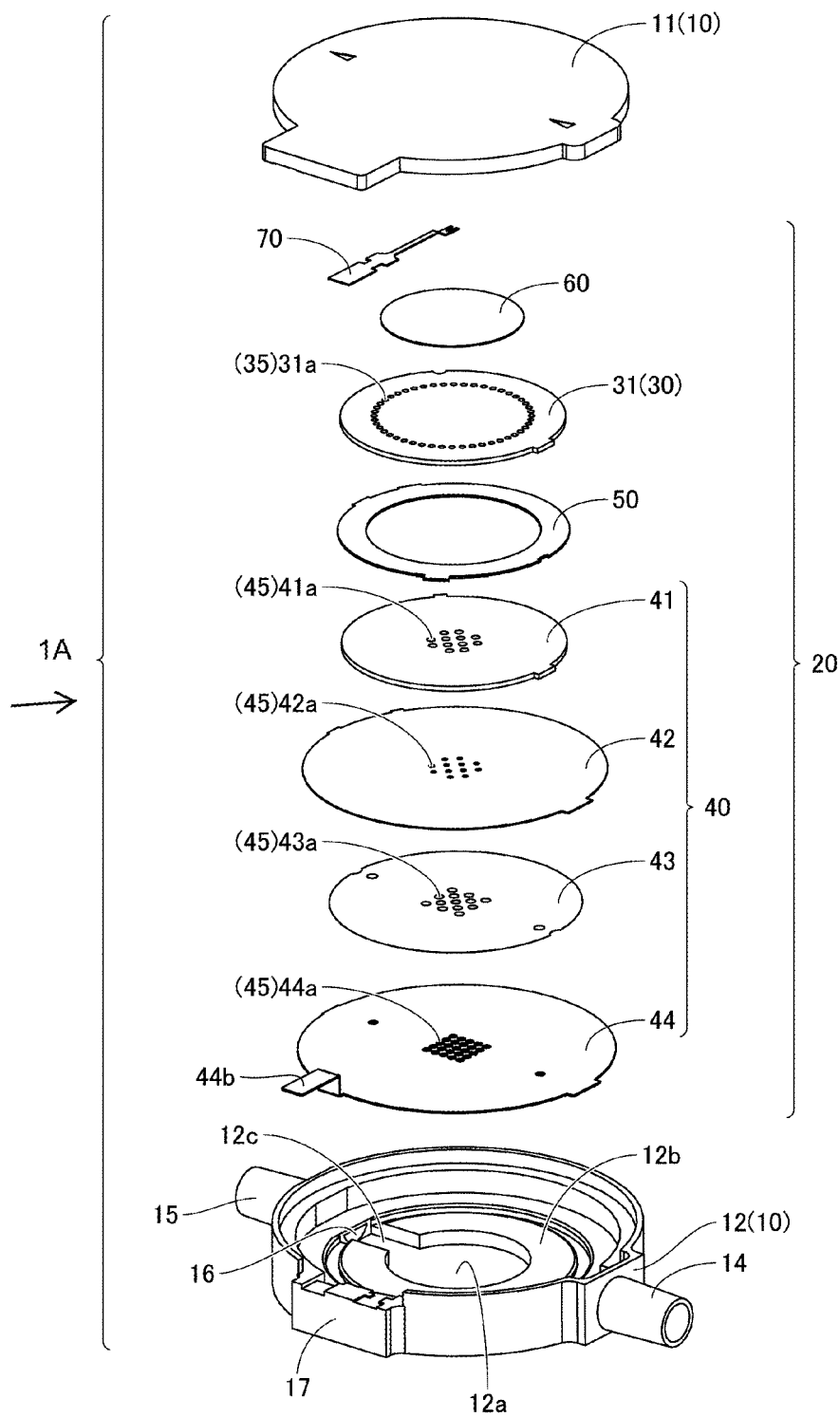
FIG. 2 is an exploded perspective view of the piezoelectric blower illustrated in FIG. 1 when viewed from obliquely above.
Figure 3:
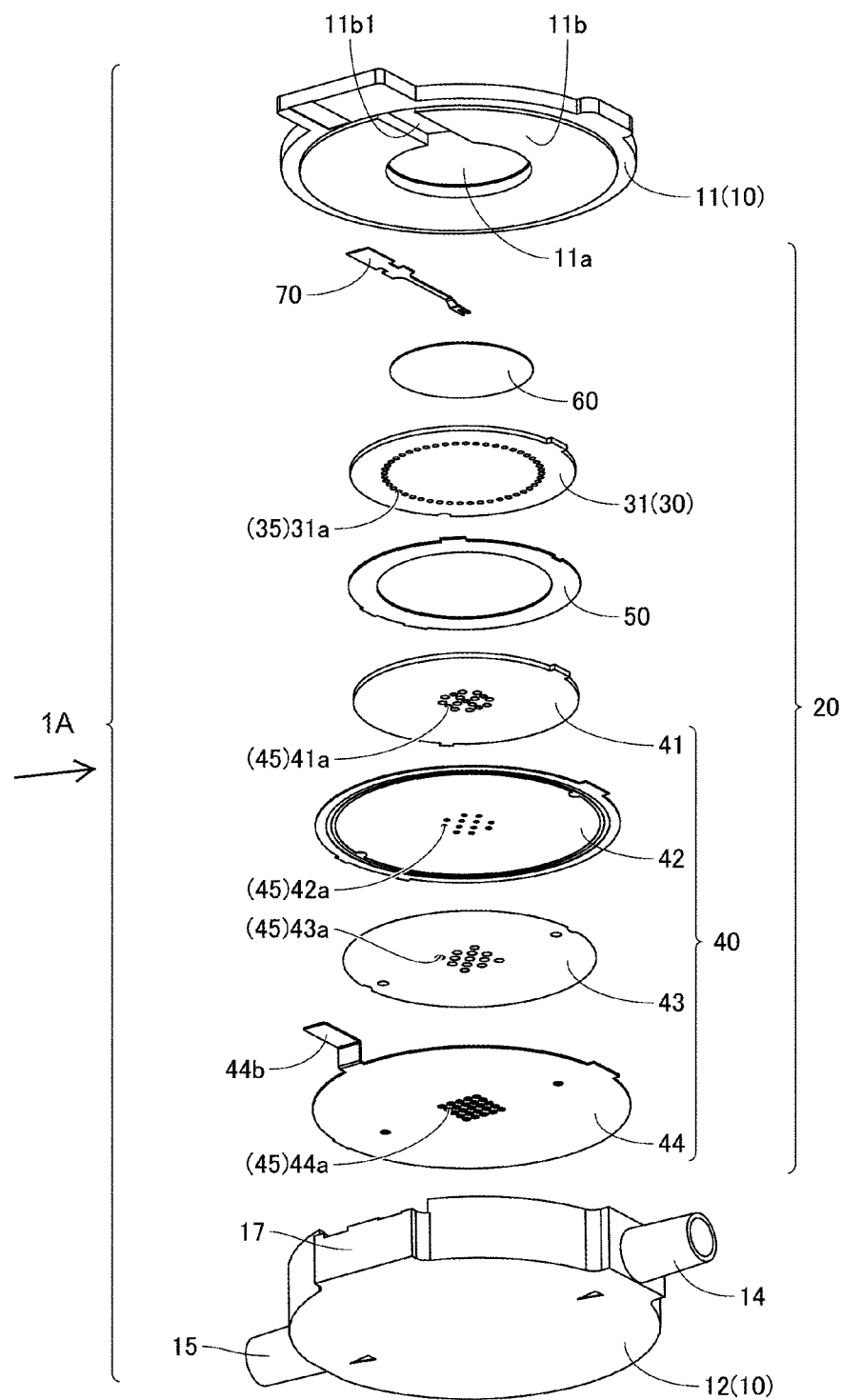
FIG. 3 is an exploded perspective view of the piezoelectric blower illustrated in FIG. 1 when viewed from obliquely below.

FIG. 1 is a schematic sectional view of a piezoelectric blower according to Embodiment 1 of the present disclosure. FIG. 2 is an exploded perspective view of the piezoelectric blower illustrated in FIG. 1 when viewed from obliquely above, and FIG. 3 is an exploded perspective view of the piezoelectric blower illustrated in FIG. 1 when viewed from obliquely below. First, a configuration of a piezoelectric blower 1A according to the present embodiment will be described with reference to FIG. 1 to FIG. 3.

As illustrated in FIG. 1 to FIG. 3, the piezoelectric blower 1A according to the present embodiment mainly includes a housing 10 and a driving unit 20. A housing space 13 that is a flat cylindrical space is provided inside the housing 10, and the driving unit 20 is disposed in the housing space 13.

The housing 10 includes a disk-shaped upper case body 11 made of resin, metal, or the like, and a flat cylindrical lower case body 12 made of resin or metal and having a bottom. The housing 10 includes the above-described housing space 13 inside thereof, since the upper case body 11 and the lower case body 12 are assembled and bonded to each other using, for example, an adhesive agent or the like.

At opposite positions of an outer peripheral portion of the lower case body 12, an upper nozzle portion 14 as a first communication portion and a lower nozzle portion 15 as a second communication portion, each protruding outward, are provided (here, the upper nozzle portion 14 and the lower nozzle portion 15 are not disposed at top and bottom positions in a height direction (that is, in a thickness direction) of the piezoelectric blower 1A, but are referred to as in this manner for convenience). A space outside the piezoelectric blower 1A and the above-described housing space 13 communicate with each other with the upper nozzle portion 14 and the lower nozzle portion 15 interposed therebetween.

The driving unit 20 mainly includes an upper vibrating body 30 as a plate-like first vibrating body, a lower vibrating body 40 as a plate-like second vibrating body, a spacer 50 as a peripheral wall portion, and a piezoelectric element 60 as a driving body. The driving unit 20 is configured by integrating these members in a state of being mutually laminated, and is held by the housing 10 in a state of being disposed in the housing space 13 of the above-described housing 10.

Here, the housing space 13 of the housing 10 is divided, by the driving unit 20, into a space on a side close to the upper case body 11 (that is, a space communicating with the upper nozzle portion 14 without necessarily a pump chamber 21 described later interposed therebetween) and a space on a side close to the lower case body 12 (that is, a space communicating with the lower nozzle portion 15 without necessarily the pump chamber 21 described later interposed therebetween).

The upper vibrating body 30 is composed of an upper vibrating plate 31. The upper vibrating plate 31 is, for example, composed of a metal thin plate made of stainless steel or the like, and an outer form thereof is a circular shape in plan view. Hole portions 31a are provided in sequence in an annular shape, in an intermediate portion of the upper vibrating plate 31 excluding a central portion and a peripheral portion. Each of the hole portions 31a corresponds to an upper hole portion 35 as a first hole portion provided in the upper vibrating body 30.

The lower vibrating body 40 is composed of a laminate of a lower vibrating plate 41, an auxiliary vibrating plate 42, a check valve 43, and a valve body holding member 44. The lower vibrating body 40 is opposed to the upper vibrating body 30, and more specifically, is disposed on a side where the lower case body 12 is positioned when viewed from the upper vibrating body 30. The lower vibrating plate 41, the auxiliary vibrating plate 42, the check valve 43, and the valve body holding member 44 are laminated and disposed in this order, the lower vibrating plate 41 being closest to the upper vibrating body 30.

The lower vibrating plate 41 is, for example, composed of a metal thin plate made of stainless steel or the like, and an outer form thereof is a circular shape in plan view. Hole portions 41a are provided at and close to a central portion of the lower vibrating plate 41.

The auxiliary vibrating plate 42 is, for example, composed of a metal thin plate made of stainless steel or the like thinner than the lower vibrating plate 41, and an outer form thereof is a circular shape in plan view. The auxiliary vibrating plate 42 is a member for forming a space for disposing the check valve 43, and an annular shaped protruding portion for forming the space is provided in a peripheral portion of a main surface positioned on a side close to the lower case body 12 of the auxiliary vibrating plate 42. The peripheral portion of the auxiliary vibrating plate 42 is bonded to a peripheral portion of the lower vibrating plate 41 by, for example, a conductive adhesive or the like. Hole portions 42a communicating with the hole portions 41a provided in the lower vibrating plate 41 are provided at and close to a central portion of the auxiliary vibrating plate 42.

The check valve 43 is composed of, for example, a resin thin plate made of polyimide resin or the like, and an outer form thereof is a circular shape in plan view. The check valve 43 is disposed in a space formed by the auxiliary vibrating plate 42 described above (that is, a space surrounded by the annular shaped protruding portion of the auxiliary vibrating plate 42). At and close to a central portion of the check valve 43, hole portions 43a are provided that do not directly face the hole portions 42a provided in the auxiliary vibrating plate 42, but are adjacent to the hole portions 42a.

The valve body holding member 44 is, for example, composed of a metal thin plate made of stainless steel or the like, and an outer form thereof is a circular shape in plan view. The valve body holding member 44 is attached to the auxiliary vibrating plate 42 so as to cover the check valve 43 disposed in the above-described space of the auxiliary vibrating plate 42. More specifically, a peripheral portion of the valve body holding member 44 is bonded to the above-described annular shaped protruding portion of the auxiliary vibrating plate 42 by, for example, a conductive adhesive or the like. Hole portions 44a communicating with the hole portions 43a provided in the check valve 43 are provided at and close to a central portion of the valve body holding member 44.

Here, the check valve 43 is loosely fitted in a space between the auxiliary vibrating plate 42 and the valve body holding member 44. Thus, the check valve 43 is movably held by the auxiliary vibrating plate 42 and the valve body holding member 44 so as to be capable of opening and closing the hole portions 42a provided in the auxiliary vibrating plate 42. More specifically, the check valve 43 closes the hole portions 42a in a state of approaching and being in close contact with the auxiliary vibrating plate 42, and opens the hole portions 42a in a state of being separated away from the auxiliary vibrating plate 42.

Note that, the hole portions 41a provided in the above-described lower vibrating plate 41, the hole portions 42a provided in the auxiliary vibrating plate 42, the hole portions 43a provided in the check valve 43, and the hole portions 44a provided in the valve body holding member 44, each corresponds to a lower hole portion 45 as a second hole portion provided in the lower vibrating body 40.

The spacer 50 is positioned between the upper vibrating body 30 and the lower vibrating body 40 and is sandwiched between the upper vibrating body 30 and the lower vibrating body 40. The spacer 50 is composed of a metal member made of, for example, stainless steel or the like, and an outer form thereof is an annular plate shape.

The spacer 50 connects a peripheral portion of the upper vibrating body 30 with a peripheral portion of the lower vibrating body 40. Accordingly, the upper vibrating body 30 and the lower vibrating body 40 are disposed so as to be spaced by a predetermined distance from each other by the spacer 50. Note that, the spacer 50 and the upper vibrating body 30 are bonded to each other by, for example, a conductive adhesive or the like, and the spacer 50 and the lower vibrating body 40 are bonded to each other by a conductive adhesive or the like, for example.

A space positioned between the upper vibrating body 30 and the lower vibrating body 40 functions as the pump chamber 21. The pump chamber 21 is defined by the upper vibrating body 30, the lower vibrating body 40, and the spacer 50, and is formed of a flat cylindrical space. Here, the spacer 50 defines the pump chamber 21 and corresponds to the peripheral wall portion that connects the upper vibrating body 30 with the lower vibrating body 40.

The piezoelectric element 60 is attached to the upper vibrating body 30, for example, with a conductive adhesive interposed therebetween. More specifically, the piezoelectric element 60 is attached to a main surface (that is, a side close to the upper case body 11) positioned on a side of the upper vibrating body 30 opposite to a side facing the pump chamber 21. The piezoelectric element 60 is composed of a thin plate made of a piezoelectric material such as lead zirconate titanate (PZT), and an outer form thereof is a circular shape in plan view.

The piezoelectric element 60 bends and vibrates when an AC voltage is applied thereto, and the flexural vibration occurring in the piezoelectric element 60 is propagated to the upper vibrating body 30 and the lower vibrating body 40, thus the upper vibrating body 30 and the lower vibrating body 40 bend and vibrate as well. That is, the piezoelectric element 60 corresponds to a driving body for bending and vibrating the upper vibrating body 30 and the lower vibrating body 40, and causes each of the upper vibrating body 30 and the lower vibrating body 40 to vibrate at a resonant frequency when an AC voltage having a predetermined frequency is applied, thereby causing standing waves to be generated in both the upper vibrating body 30 and the lower vibrating body 40.

Note that, the peripheral portion of the valve body holding member 44 is bonded to the lower case body 12 by, for example, an adhesive or the like. Thus, the driving unit 20 composed of the upper vibrating body 30, the lower vibrating body 40, the spacer 50, the piezoelectric element 60, and the like is held inside the housing 10.

Referring to FIG. 2 and FIG. 3, the driving unit 20 further includes a pair of external connection terminals as power supply lines for applying a voltage to the piezoelectric element 60 from an outside. The pair of external connection terminals is composed of a first terminal 70 composed of a different member from the upper vibrating body 30, the lower vibrating body 40, and the spacer 50 described above, and a second terminal 44b provided in the valve body holding member 44 included in the lower vibrating body 40.

One end of the first terminal 70 is bonded to a main surface of the piezoelectric element 60 on a side close to the upper case body 11, for example, by soldering or the like, and another end thereof is led out so as to be exposed outward from the housing 10. On the other hand, the second terminal 44b is formed of a portion in a tongue shape extending outward from a predetermined position of an outer end of the valve body holding member 44, and a distal end thereof is led out so as to be exposed outward from the housing 10.

Here, the valve body holding member 44 provided with the second terminal 44b is electrically connected to a main surface of the piezoelectric element 60 on a side close to the lower case body 12, with a conductive adhesive or the like for bonding the piezoelectric element 60 and the upper vibrating plate 31, the upper vibrating plate 31, the spacer 50, the lower vibrating plate 41, the auxiliary vibrating plate 42, and conductive adhesives or the like for mutually bonding these components, and a conductive adhesive or the like for bonding the valve body holding member 44 and the auxiliary vibrating plate 42 interposed therebetween, thus the second terminal 44b described above functions as one of the external connection terminals forming the pair.

Note that, both the above-described other end of the first terminal 70 and the above-described distal end of the second terminal 44b are exposed outward from the housing 10 by being led out onto a terminal support 17 provided at a predetermined position in the outer peripheral portion of the lower case body 12.

With the above configuration, in the piezoelectric blower 1A according to the present embodiment, the pump chamber 21 is positioned between the upper nozzle portion 14 and the lower nozzle portion 15, and in the housing space 13 of the housing 10, a space on a side close to the upper nozzle portion 14 with respect to a position where the pump chamber 21 is provided and the pump chamber 21 are in a state of constantly communicating with each other by the upper hole portions 35 provided in the upper vibrating body 30, and in the housing space 13 of the housing 10, a space on a side close to the lower nozzle portion 15 with respect to the position where the pump chamber 21 is provided and the pump chamber 21 are, in a state where the lower hole portions 45 provided in the lower vibrating body 40 are not closed by the check valve 43, in a state of communicating with each other by the lower hole portions 45.

Referring to FIG. 1, in the piezoelectric blower 1A according to the present embodiment, the piezoelectric element 60 causes the upper vibrating body 30 and the lower vibrating body 40 to bend and vibrate so that standing waves occur in both the upper vibrating body 30 and the lower vibrating body 40 about an axis line 100 orthogonal to a central portion of the upper vibrating body 30 and a central portion of the lower vibrating body 40. More specifically, the piezoelectric element 60 causes the upper vibrating body 30 and the lower vibrating body 40 to bend and vibrate so that an antinode of vibration is formed in each of the central portion of the upper vibrating body 30 and the central portion of the lower vibrating body 40.

At that time, the piezoelectric element 60 directly drives the upper vibrating body 30 to which the piezoelectric element 60 is attached, and indirectly drives the lower vibrating body 40, to which the piezoelectric element 60 is not attached, with the spacer 50 as the peripheral wall portion interposed therebetween. At this time, by appropriately designing respective shapes of the upper vibrating body 30 and the lower vibrating body 40 (particularly, respective thicknesses of the vibrating plates), the upper vibrating body 30 and the lower vibrating body 40 are displaced in opposite directions.

The pump chamber 21 repeats expansion and contraction due to the vibration of the upper vibrating body 30 and the lower vibrating body 40 in the opposite directions. Accordingly, resonance occurs inside the pump chamber 21, and along with the occurrence of resonance, large pressure fluctuation occurs in the pump chamber 21. As a result, a positive pressure and a negative pressure occur in the pump chamber 21 alternately in terms of time, and a pumping function for pumping gas is realized by the pressure fluctuation.

Here, as illustrated in FIG. 1 to FIG. 3, in the piezoelectric blower 1A according to the present embodiment, a predetermined concave and convex shape is given to a wall surface defining the housing space 13 of the housing 10. The concave and convex shape is provided to suppress occurrence of large pressure fluctuation in a space which is part of the housing space 13 and in which the driving unit 20 is not disposed (that is, a space outside the pump chamber 21) during operation of the piezoelectric blower 1A, which will be described later in detail.

Figure 4:
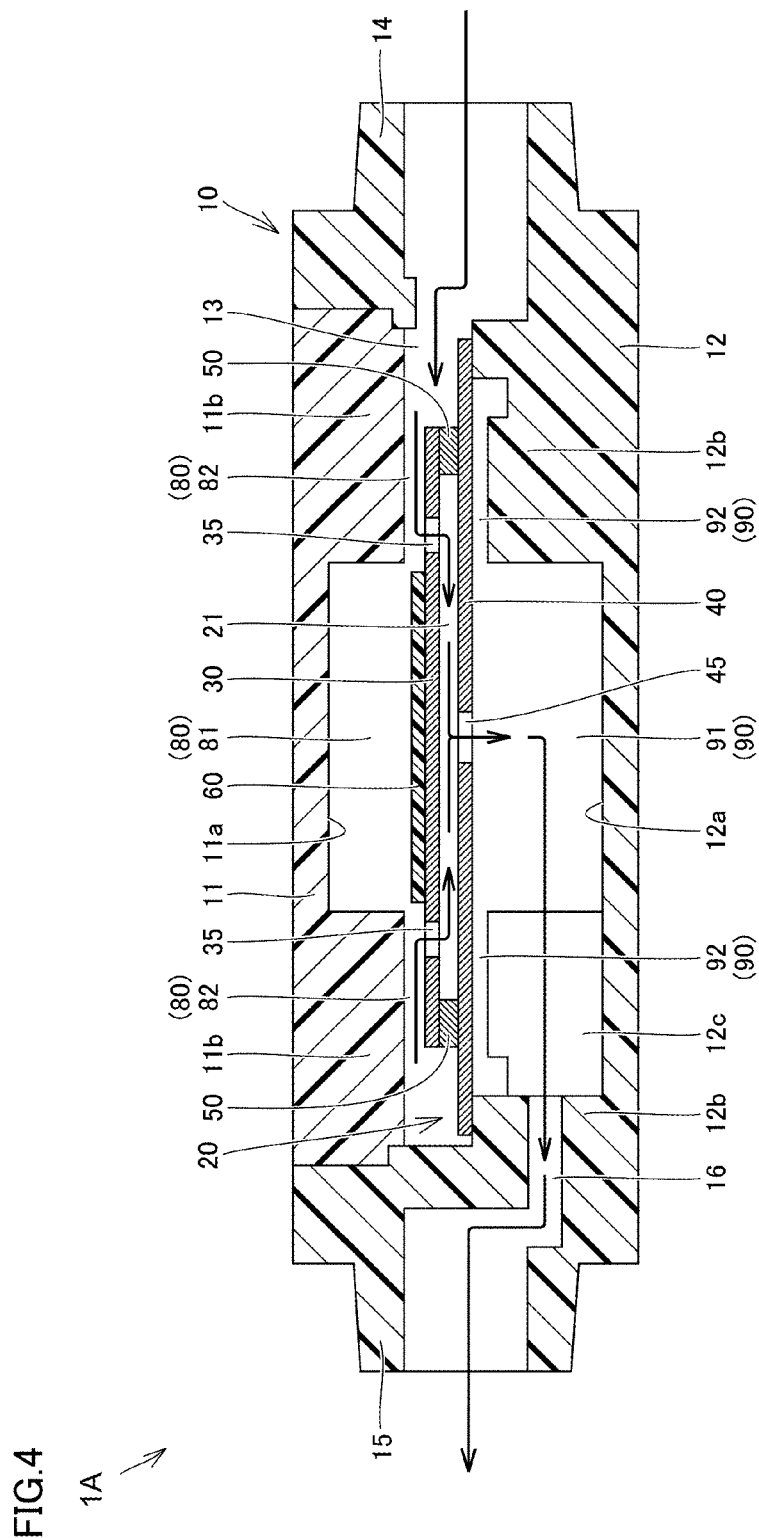
FIG. 4 is a schematic diagram illustrating a configuration of the piezoelectric blower illustrated in FIG. 1 and an approximate direction of a gas flow occurring during operation.
Figure 5A:
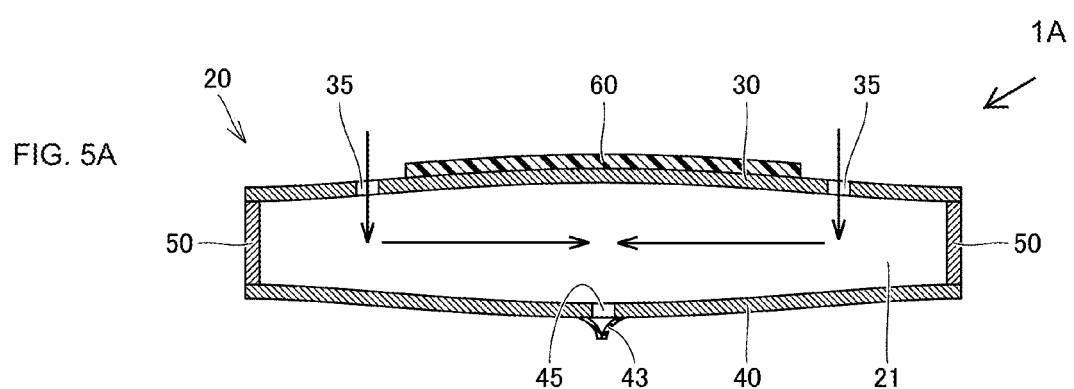
FIGS. 5A and 5B are schematic diagrams illustrating an operating state of a driving unit of the piezoelectric blower illustrated in FIG. 1 and a direction of a gas flow occurring in the operating state over time.
Figure 5B:
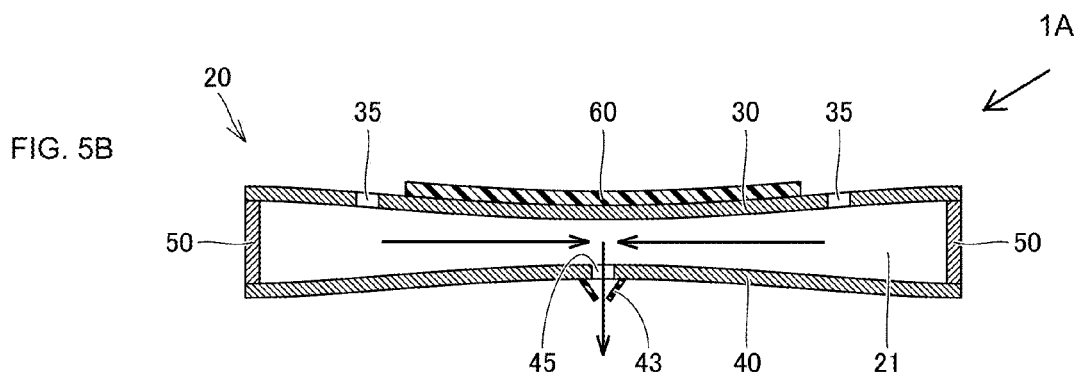

FIG. 4 is a schematic diagram illustrating a configuration of the driving unit of the piezoelectric blower illustrated in FIG. 1 and an approximate direction of a gas flow occurring during operation, and FIGS. 5A and 5B are schematic diagrams illustrating the operating state of the driving unit of the piezoelectric blower illustrated in FIG. 1 and a direction of a gas flow occurring in the operating state over time. Next, with reference to FIG. 4 and FIGS. 5A and 5B, the operating state of the piezoelectric blower 1A according to the present embodiment will be described in detail. Note that, in FIG. 4 and FIGS. 5A and 5B, a shape of the piezoelectric blower 1A is considerably simplified and schematically illustrated in order to facilitate understanding and for the convenience of drawing.

Referring to FIG. 4, in the piezoelectric blower 1A according to the present embodiment, as described above, a check valve is not attached to each of the upper hole portions 35 provided in the upper vibrating body 30, and on the other hand, the check valve 43 (not illustrated in FIG. 4, see FIG. 1 or the like) is attached for each of the lower hole portions 45 (illustrated as one hole in FIG. 4 and FIGS. 5A and 5B) provided in the lower vibrating body 40.

The check valve 43 provided for each of the lower hole portions 45 is configured to allow gas to flow from the pump chamber 21 toward a space on a side close to the lower nozzle portion 15 of the housing space 13 of the housing 10, but not to allow gas to flow in an opposite direction thereto. Thus, a direction of a gas flow occurring during operation of the piezoelectric blower 1A is determined by the action of the check valve 43, and an approximate direction of the gas flow is a direction indicated by an arrow in FIG. 4.

Here, when attention is paid to a gas flow occurring in a vicinity of the driving unit 20, as illustrated in FIG. 5A, in a state in which the upper vibrating body 30 and the lower vibrating body 40 are displaced in respective directions so as to move away from each other, the pump chamber 21 expands, and accordingly, a negative pressure occurs in the pump chamber 21. In association with the occurrence of the negative pressure, gas is pulled into the pump chamber 21 via the upper hole portions 35 provided in the upper vibrating body 30. Note that, in that case, the check valve 43 (illustrated schematically in FIGS. 5A and 5B) attached to the lower hole portion 45 provided in the lower vibrating body 40 closes the lower hole portion 45 in association with the occurrence of the negative pressure in the pump chamber 21.

Thereafter, as illustrated in FIG. 5B, in a state in which the upper vibrating body 30 and the lower vibrating body 40 are displaced in respective directions so as to approach each other, the pump chamber 21 contracts, and accordingly, a positive pressure occurs in the pump chamber 21. In association with the occurrence of the positive pressure, the check valve 43 attached to each of the lower hole portions 45 provided in the lower vibrating body 40 opens the lower hole portion 45, thereby discharging gas from the pump chamber 21 via the lower hole portions 45.

By the upper vibrating body 30 and the lower vibrating body 40 vibrating such that the state illustrated in FIG. 5A and the state illustrated in FIG. 5B are alternately repeated, the gas flow in the direction illustrated in FIG. 4 occurs in the piezoelectric blower 1A. Thus, the upper nozzle portion 14 provided in the housing 10 functions as a suction nozzle for pulling gas in from an outside, and the lower nozzle portion 15 provided in the housing 10 functions as a discharge nozzle for discharging gas to the outside, thus gas is pumped by the piezoelectric blower 1A.

Referring to FIG. 4, gas pulled in from the upper nozzle portion 14 reaches the upper hole portions 35 provided in the upper vibrating body 30 via a space positioned between the upper case body 11 and the upper vibrating body 30. Thus, the space positioned between the upper case body 11 and the upper vibrating body 30 forms a flow path connecting the upper nozzle portion 14 with the pump chamber 21, and the space corresponds to an upper gas chamber 80 as a first chamber. That is, a portion of the upper case body 11 disposed on a side opposite to a side where the lower vibrating body 40 is positioned when viewed from the upper vibrating body 30 corresponds to a first wall portion defining the first chamber.

On the other hand, gas discharged from the lower hole portions 45 provided in the lower vibrating body 40 reaches the lower nozzle portion 15 via a space positioned between the lower case body 12 and the lower vibrating body 40. Thus, the space positioned between the lower case body 12 and the lower vibrating body 40 forms a flow path connecting the pump chamber 21 with the lower nozzle portion 15, and the space corresponds to a lower gas chamber 90 as a second chamber. That is, a portion of the lower case body 12 disposed on a side opposite to a side where the upper vibrating body 30 is positioned when viewed from the lower vibrating body 40 corresponds to a second wall portion defining the second chamber.

Here, as described above, in the piezoelectric blower 1A according to the present embodiment, the predetermined concave and convex shape is given to the wall surface defining the housing space 13 of the housing 10. Specifically, the predetermined concave and convex shape is given to a portion defining the upper gas chamber 80 described above of the upper case body 11, and the predetermined concave and convex shape is given to a portion defining the lower gas chamber 90 described above of the lower case body 12.

More specifically, as illustrated in FIG. 1 to FIG. 4, the first wall portion of the upper case body 11 is provided with an upper concave portion 11a as a first concave portion that opens toward the upper vibrating body 30 and that is opposed to a portion including the central portion of the upper vibrating body 30, and an upper circumferential portion 11b as an annular shaped first circumferential portion that protrudes toward the upper vibrating body 30 is positioned at a portion of the first wall portion adjacent to the upper concave portion 11a (that is, a portion adjacent to the upper concave portion 11a in a direction orthogonal to the axis line 100 (see FIG. 1)). The upper circumferential portion 11b overlaps with an outer peripheral region including the peripheral portion of the upper vibrating body 30 in a direction parallel to the extending direction of the axis line 100.

Accordingly, the upper gas chamber 80 includes an upper wide portion 81, as a first wide portion that is defined by the upper concave portion 11a and a portion of the upper vibrating body 30 opposed to the upper concave portion 11a, and an upper narrow portion 82 as a first narrow portion that is defined by the upper circumferential portion 11b and a portion of the upper vibrating body 30 opposed to the upper circumferential portion 11b, and the upper narrow portion 82 overlaps with part of the upper vibrating body 30 in the direction parallel to the extending direction of the axis line 100. Note that, in the present embodiment, the upper hole portions 35 described above are disposed in a portion of the upper vibrating body 30 facing the upper narrow portion 82 (that is, a portion opposed to the upper circumferential portion 11b).

Thus, gas pulled in from the upper nozzle portion 14 flows into the upper narrow portion 82 via a space positioned around the driving unit 20 in a direction orthogonal to the axis line 100, and most of the gas flowing into the upper narrow portion 82 flows into the upper hole portions 35 provided so as to face the upper narrow portion 82.

Note that, referring to FIG. 3, a groove-shaped portion provided in the upper circumferential portion 11b of the upper case body 11 is a terminal insertion portion 11b1 for leading a first terminal 70 out toward the terminal support 17.

On the other hand, the second wall portion of the lower case body 12 is provided with a lower concave portion 12a as a second concave portion that opens toward the lower vibrating body 40 and that is opposed to a portion including the central portion of the lower vibrating body 40, and a lower circumferential portion 12b as an annular shaped second circumferential portion that protrudes toward the lower vibrating body 40 is positioned at a portion of the second wall portion adjacent to the lower concave portion 12a (that is, a portion adjacent to the lower concave portion 12a in the direction orthogonal to the axis line 100). The lower circumferential portion 12b overlaps with an outer peripheral region including the peripheral portion of the lower vibrating body 40 in the direction parallel to the extending direction of the axis line 100.

Accordingly, the lower gas chamber 90 includes a lower wide portion 91, as a second wide portion that is defined by the lower concave portion 12a and a portion of the lower vibrating body 40 opposed to the lower concave portion 12a, and a lower narrow portion 92 as a second narrow portion that is defined by the lower circumferential portion 12b and a portion of the lower vibrating body 40 opposed to the lower circumferential portion 12b, and the lower narrow portion 92 overlaps with part of the lower vibrating body 40 in the direction parallel to the extending direction of the axis line 100. Note that, in the present embodiment, the lower hole portions 45 described above are disposed in a portion of the lower vibrating body 40 facing the lower wide portion 91.

Here, a groove portion 12c extending along a radial direction is provided at a predetermined position in the lower circumferential portion 12b of the lower case body 12, and a flow path portion 16 communicating the groove portion 12c with the lower nozzle portion 15 and having a sufficiently small cross-sectional area is provided in a portion of the lower circumferential portion 12b facing an outer end of the groove portion 12c. Accordingly, the lower wide portion 91 and the lower nozzle portion 15 communicate with each other with the groove portion 12c and the flow path portion 16 interposed therebetween.

Thus, gas discharged from the lower hole portions 45 flows into the groove portion 12c through the lower wide portion 91, and the gas flowing into the groove portion 12c flows into the lower nozzle portion 15 through the flow path portion 16.

With such configuration, in the piezoelectric blower 1A according to the present embodiment, pump performance can be improved as compared to the related art without necessarily increasing the size of a device. A reason why the pump performance can be improved without necessarily increasing the size of a device by using the piezoelectric blower 1A according to the present embodiment will be described in detail below.

FIGS. 6A, 6B, and 6C are schematic diagrams illustrating pressure fluctuation occurring in the pump chamber, the upper wide portion, and the lower wide portion of the piezoelectric blower illustrated in FIG. 1. Here, FIG. 6A schematically illustrates the configuration, which is considerably simplified, of the piezoelectric blower 1A according to the present embodiment, and FIG. 6B schematically illustrates pressure distribution of each of the pump chamber 21, the upper wide portion 81, and the lower wide portion 91 in the state illustrated in FIG. 5A described above (hereinafter referred to as a first state), and FIG. 6C schematically illustrates pressure distribution in each of the pump chamber 21, the upper wide portion 81, and the lower wide portion 91 in the state illustrated in FIG. 5B described above (hereinafter referred to as a second state).

As is apparent from FIG. 6B and FIG. 6C, in the piezoelectric blower 1A according to the present embodiment, the upper vibrating body 30 and the lower vibrating body 40 are driven under the above-described conditions in which resonance occurs in the pump chamber 21, thereby an antinode of pressure fluctuation inside the pump chamber 21 being generated in a central portion of the pump chamber 21, and a node of the pressure fluctuation inside the pump chamber 21 being generated in an outer edge portion of the pump chamber 21.

At that time, pressure fluctuation occurs in the upper wide portion 81 with a central portion of the upper wide portion 81 being an antinode and an outer edge portion of the upper wide portion being a node, and pressure fluctuation occurs in the lower wide portion 91 with a central portion of the lower wide portion 91 being an antinode and an outer edge portion of the lower wide portion being a node. However, pressure amplitude of the pressure fluctuation in these upper wide portion 81 and lower wide portions 91 is significantly smaller compared to that in the pressure fluctuation in the pump chamber 21, and is substantially negligible, to an extent as illustrated, in the first state and the second state in which the pressure amplitude in the upper wide portion 81 and lower wide portion 91 is maximized.

This is because no resonance occurs in the upper gas chamber 80 including the upper wide portion 81 and the upper narrow portion 82, and because no resonance occurs in the lower gas chamber 90 including the lower wide portion 91 and the lower narrow portion 92. That is, by adopting the above configuration, a side surface of the upper concave portion 11a defining the upper wide portion 81 functions as a reflection end of pressure propagation occurring in the upper gas chamber 80, and a side surface of the lower concave portion 12a defining the lower wide portion 91 functions as a reflection end of the pressure propagation occurring in the lower gas chamber 90, thus a condition under which resonance occurs is canceled in the upper gas chamber 80 and the lower gas chamber 90.

Thus, it is possible to significantly inhibit the pressure fluctuation occurring in the upper gas chamber 80 facing the upper vibrating body 30 from acting to hinder displacement of the upper vibrating body 30, and it is possible to significantly inhibit the pressure fluctuation occurring in the lower gas chamber 90 facing the lower vibrating body 40 from acting to hinder displacement of the lower vibrating body 40.

Thus, by using the piezoelectric blower 1A according to the present embodiment, pump performance (that is, an increase in flow rate, an increase in suction pressure, an increase in discharge pressure, and the like) can be improved without necessarily increasing the size of a device.

Note that, it is understandable that a flow rate can be increased by adopting such configuration from results of a first verification test and a second verification test described later that are performed by using piezoelectric blowers according to a first modification and a second modification described below.

Here, in the piezoelectric blower 1A according to the present embodiment, the upper vibrating body 30 is formed in the disc shape, and the upper wide portion 81 is formed of the cylindrical space. In the case of adopting this configuration, since axial symmetry of a gas flow in the piezoelectric blower 1A is improved, turbulence is less likely to occur in a gas flow, an efficient gas flow can be realized, and a flow rate can be increased as a result. However, it is not necessary to adopt the above configuration, and a shape of each of the upper vibrating body 30 and the upper wide portion 81 is appropriately selected. Although detailed description will be omitted here, the same applies to the lower vibrating body 40 and the lower wide portion 91.

In addition, in the piezoelectric blower 1A according to the present embodiment, an arrangement position of the upper wide portion 81 can be appropriately set such that a central axis of the upper wide portion 81 formed of the cylindrical space coincides with the above-described axis line 100 orthogonal to the central portion of the upper vibrating body 30. Also in the case of adopting this configuration, axial symmetry of a gas flow in the piezoelectric blower 1A is improved, thus a flow rate can be increased as a result. Although detailed description will be omitted here, the same applies to the lower wide portion 91.

In addition, in the piezoelectric blower 1A according to the present embodiment, the upper hole portions 35 provided in the upper vibrating body 30 are arranged in sequence at positions on a circumference about the axis line 100. Also in the case of adopting this configuration, axial symmetry of a gas flow in the piezoelectric blower 1A is improved, thus a flow rate can be increased as a result. However, the number of upper hole portions 35 provided in the upper vibrating body 30 is not particularly limited, and the arrangement positions thereof are not particularly limited as well.

In addition, in the piezoelectric blower 1A according to the present embodiment, both the upper nozzle portion 14 and the lower nozzle portion 15 are disposed so as not to overlap with the driving unit 20 in the direction parallel to the extending direction of the axis line 100. With this configuration, a device can be made thinner, and as a result, improvement of pump performance and reduction of the size of a device can be achieved at the same time.

In addition, in the piezoelectric blower 1A according to the present embodiment, the upper narrow portion 82 is configured so as to overlap with part of the upper vibrating body 30 (that is, an outer peripheral region of the upper vibrating body 30) in the direction parallel to the extending direction of the axis line 100, and also, the upper hole portions 35 are provided so as to face the upper narrow portion 82, and thus the upper nozzle portion 14 and the pump chamber 21 are configured to communicate with each other with the upper narrow portion 82 interposed therebetween, and the upper nozzle portion 14 and the upper wide portion 81 are configured to communicate with each other with the upper narrow portion 82 interposed therebetween. Thus, since the upper narrow portion 82 functions as a kind of orifice for making the pump chamber 21 and the upper wide portion 81 less susceptible to influence from an outside of the piezoelectric blower 1A, the driving unit 20 stably operates, and pump performance can be improved in this regard as well.

Further, in the piezoelectric blower 1A according to the present embodiment, the lower wide portion 91 and the lower nozzle portion 15 are configured to communicate with each other with the flow path portion 16 having a sufficiently small cross-sectional area interposed therebetween. Thus, since the flow path portion 16 functions as a kind of orifice for making the pump chamber 21 and the lower wide portion 91 less susceptible to influence from an outside of the piezoelectric blower 1A, the driving unit 20 stably operates, and pump performance can be improved in this regard as well.

Further, in the piezoelectric blower 1A according to the present embodiment, when a diameter of the upper vibrating body 30 is Ra1 and a diameter of the upper wide portion 81 is Rb1, a condition of 0.4≤Rb1/Ra1<1.0 can be satisfied, and when a diameter of the lower vibrating body 40 is Ra2 and a diameter of the lower wide portion 91 is Rb2, a condition of 0.4≤Rb2/Ra2<1.0 can be satisfied. When either or both of these conditions are satisfied, pump performance can be improved reliably.

Note that, dimensions of respective portions of the piezoelectric blower 1A according to the present embodiment described above are not particularly limited, but an example thereof is as follows.

A diameter of the housing 10 is, for example, 28 [mm], and a thickness thereof is, for example, 5 [mm]. A diameter of the housing space 13 is, for example, 24.5 [mm], and a height thereof (that is, a distance from a bottom surface of the upper concave portion 11a to a bottom surface of the lower concave portion 12a) is, for example, 3.91 [mm]. A diameter of each of the upper nozzle portion 14 and the lower nozzle portion 15 is about 3 [mm], for example.

A diameter of the upper vibrating body 30 is, for example, 17 [mm], and a diameter included therein of a portion defining the pump chamber 21 is 13.2 [mm], for example. A thickness of the upper vibrating body 30 is 0.4 [mm], for example. The upper hole portions 35 provided in the upper vibrating body 30 are disposed in sequence in an annular shape at positions distanced, for example, 5.93 [mm] from the central portion of the upper vibrating body 30, and respective opening diameters thereof are, for example, 0.46 [mm].

A diameter of the lower vibrating body 40 is, for example, [mm], and a thickness thereof is 0.62 [mm], for example. A diameter of the lower vibrating plate 41 is, for example, 17 [mm], and a diameter included therein of a portion defining the pump chamber 21 is 13.2 [mm], for example. A thickness of the lower vibrating plate 41 is, for example, 0.4 [mm]. Respective opening diameters of the lower hole portions 45 provided in the lower vibrating body 40 are 0.4 [mm], for example.

An outer diameter of the spacer 50 is, for example, 17 [mm], and an inner diameter thereof is 13.2 [mm], for example. A thickness of the spacer 50 is, for example, 0.15 [mm]. An inner diameter of the pump chamber 21 is 13.2 [mm], for example, and a height thereof is, for example, 0.2 [mm].

A diameter of the upper wide portion 81 is, for example, 11 [mm]. A height of the upper wide portion 81 is, for example, 1.39 [mm], and a depth included therein of the upper concave portion 11a is 1 [mm], for example. A height of the upper narrow portion 82 is, for example, 0.39 [mm].

A diameter of the lower wide portion 91 is, for example, 11 [mm]. A height of the lower wide portion 91 is, for example, 1.3 [mm], and a depth included therein of the lower concave portion 12a is 1.15 [mm], for example. A height of the lower narrow portion 92 is, for example, 0.15 [mm].

A diameter of the piezoelectric element 60 is, for example, 10.8 [mm], and a thickness thereof is 0.1 [mm], for example. A diameter of the flow path portion 16 is, for example, 1 [mm].

First Modification

Figure 7A:
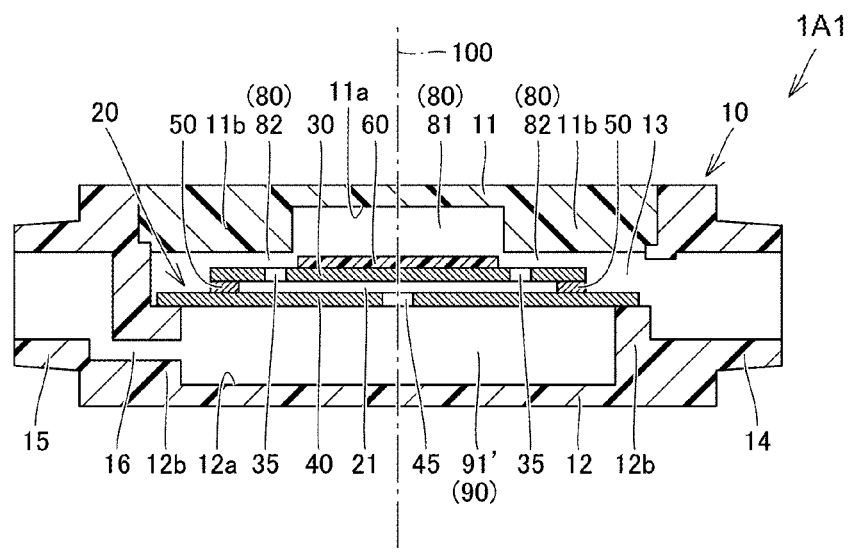
FIGS. 7A and 7B are diagrams illustrating a configuration of a piezoelectric blower according to a first modification and a result of a first verification test.
Figure 7B:
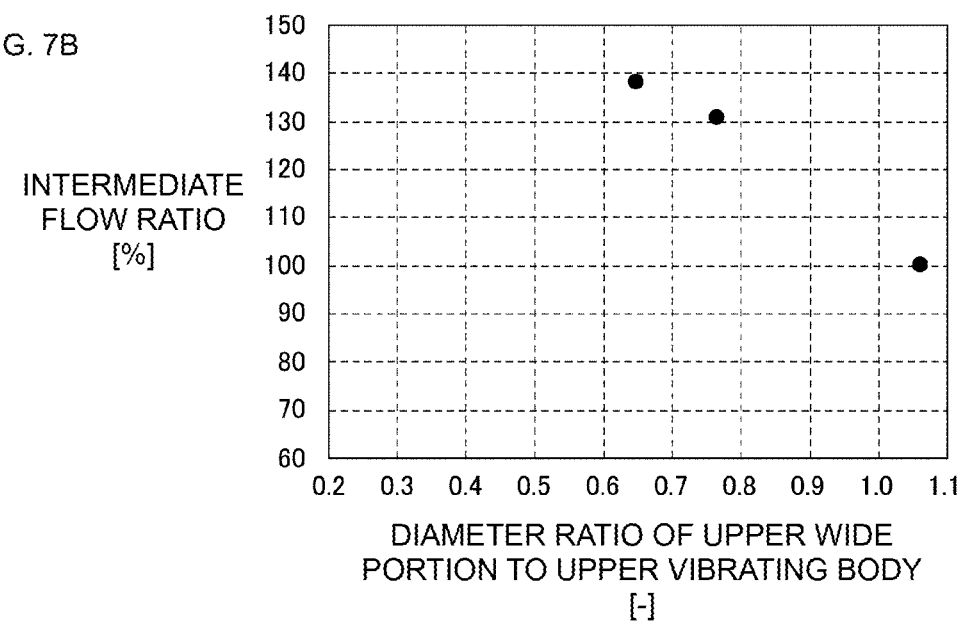

FIGS. 7A and 7B are diagrams illustrating a configuration of a piezoelectric blower according to a first modification and a result of a first verification test. With reference to FIGS. 7A and 7B, a description will be given of a configuration of a piezoelectric blower 1A1 according to the present modification and the first verification test performed by using the piezoelectric blower 1A1.

As illustrated in FIG. 7A, the configuration of the piezoelectric blower 1A1 according to the present modification differs from that of the piezoelectric blower 1A according to Embodiment 1 described above only in a shape of the lower gas chamber 90. Specifically, in the piezoelectric blower 1A1 according to the present modification, the lower concave portion 12a is configured to have a diameter larger than that of the pump chamber 21, thus a lower wide portion 91' mainly defined by the lower concave portion 12a is configured to have substantially the same size as that of the lower vibrating body 40. In other words, the piezoelectric blower 1A1 according to the present modification does not substantially include the lower narrow portion 92 included in the piezoelectric blower 1A according to Embodiment 1.

In the case of adopting this configuration, it is basically impossible to prevent displacement of the lower vibrating body 40 from being hindered by pressure fluctuation occurring in the lower gas chamber 90 facing the lower vibrating body 40. On the other hand, however, it is possible to prevent displacement of the upper vibrating body 30 from being hindered by pressure fluctuation occurring in the upper gas chamber 80 facing the upper vibrating body 30, accordingly, a flow rate can be increased.

Here, in the first verification test, a prototype of the piezoelectric blower 1A1 according to the present modification was actually manufactured, and a diameter of the upper concave portion 11a provided in the upper case body 11 was changed variously, to confirm how a flow rate changes when a diameter ratio of the upper wide portion 81 to the upper vibrating body 30 is changed variously. Note that, the change in flow rate was compared by using an intermediate flow ratio during operation when a back pressure was −10 kPa, and as a reference, the above diameter ratio of 1.0 was defined as 100%.

As illustrated in FIG. 7B, in the first verification test, a result was obtained in which, when the diameter ratio of the upper wide portion 81 to the upper vibrating body 30 was about 0.76, the intermediate flow ratio increased to about 132%, and when the diameter ratio of the upper wide portion 81 to the upper vibrating body 30 was about 0.64, the intermediate flow ratio increased to about 138%.

Thus, even when the piezoelectric blower 1A1 according to the present modification is used, the effects described above in Embodiment 1 can be obtained to a considerable extent.

Second Modification

Figure 8A:
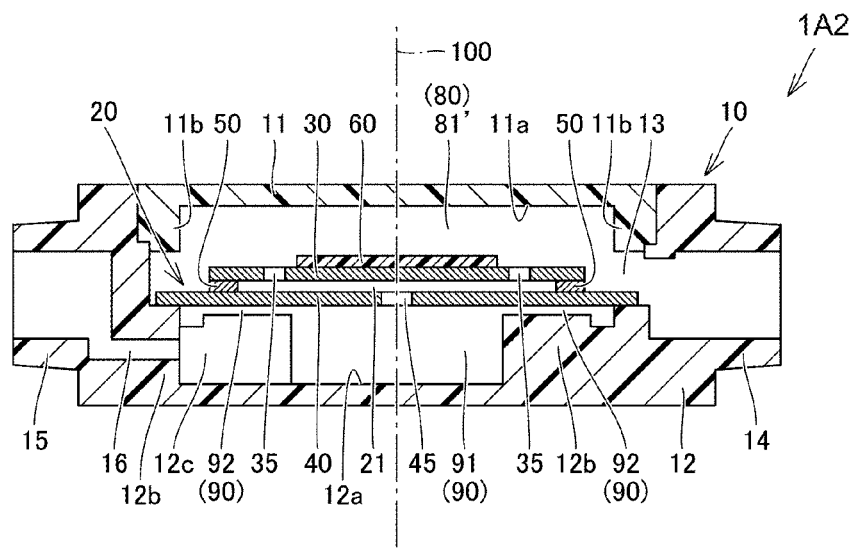
FIGS. 8A and 8B are diagrams illustrating a configuration of a piezoelectric blower according to a second modification and a result of a second verification test.
Figure 8B:
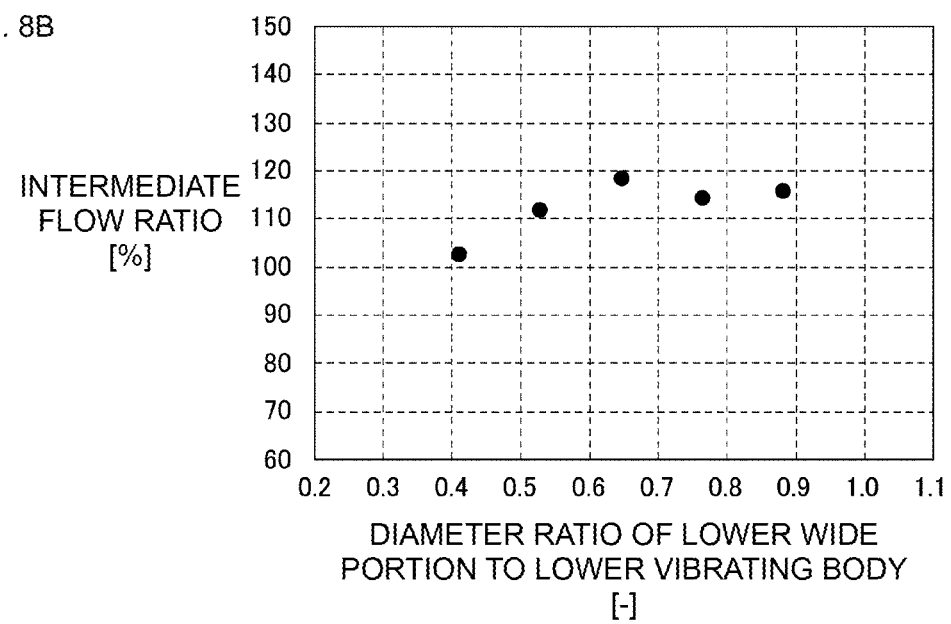

FIGS. 8A and 8B are diagrams illustrating a configuration of a piezoelectric blower according to a second modification and a result of a second verification test. With reference to FIGS. 8A and 8B, a description will be given of a configuration of a piezoelectric blower 1A2 according to the present modification and the second verification test performed by using the piezoelectric blower 1A2.

As illustrated in FIG. 8A, the configuration of the piezoelectric blower 1A2 according to the present modification differs from that of the piezoelectric blower 1A according to Embodiment 1 described above only in a shape of the upper gas chamber 80. Specifically, in the piezoelectric blower 1A2 according to the present modification, the upper concave portion 11a is configured to have a diameter larger than that of the pump chamber 21, so that a upper wide portion 81' mainly defined by the upper concave portion 11a is configured to be larger than the upper vibrating body 30. In other words, the piezoelectric blower 1A2 according to the present modification does not substantially include the upper narrow portion 82 included in the piezoelectric blower 1A according to Embodiment 1.

Here, in the piezoelectric blower 1A2 according to the present modification, the upper vibrating body 30 and the lower vibrating body 40 correspond to a second vibrating body and a first vibrating body, respectively, and the upper hole portion 35 and the lower hole portion 45 correspond to a second hole portion and a first hole portion, respectively. Further, the upper gas chamber 80 and the lower gas chamber 90 correspond to a second chamber and a first chamber, respectively, and part of a wall portion of the upper case body 11 and part of a wall portion of the lower case body 12 correspond to a second wall portion and a first wall portion, respectively.

Further, in the piezoelectric blower 1A2 according to the present modification, the upper concave portion 11a and the lower concave portion 12a correspond to a second concave portion and a first concave portion, respectively, and the upper circumferential portion 11b and the lower circumferential portion 12b correspond to a second circumferential portion and a first circumferential portion, respectively. Further, the upper nozzle portion 14 and the lower nozzle portion 15 correspond to a second nozzle portion and a first nozzle portion, respectively.

In the case of adopting this configuration, it is basically impossible to prevent displacement of the upper vibrating body 30 from being hindered by pressure fluctuation occurring in the upper gas chamber 80 facing the upper vibrating body 30. On the other hand, however, it is possible to prevent displacement of the lower vibrating body 40 from being hindered by pressure fluctuation occurring in the lower gas chamber 90 facing the lower vibrating body 40, accordingly, a flow rate can be increased.

Here, in the second verification test, a prototype of the piezoelectric blower 1A2 according to the present modification was actually manufactured, and a diameter of the lower concave portion 12a provided in the lower case body 12 was changed variously, to confirm how a flow rate changes when a diameter ratio of the lower wide portion 91 to the lower vibrating body 40 is changed variously. Note that, the change in flow rate was compared by using an intermediate flow ratio during operation when a back pressure was −10 kPa, and as a reference, the above diameter ratio of 1.0 was defined as 100%.

As illustrated in FIG. 8B, in the second verification test, a result was obtained in which, when a diameter ratio of the lower wide portion 91 to the lower vibrating body 40 was about 0.88, an intermediate flow ratio increased to about 116%, when the diameter ratio of the lower wide portion 91 to the lower vibrating body 40 was about 0.76, the intermediate flow ratio increased to about 114%, when the diameter ratio of the lower wide portion 91 to the lower vibrating body 40 was about 0.64, the intermediate flow ratio increased to about 118%, when the diameter ratio of the lower wide portion 91 to the lower vibrating body 40 was about 0.53, the intermediate flow ratio increased to about 112%, and when the diameter ratio of the lower wide portion 91 to the lower vibrating body 40 was about 0.42, the intermediate flow ratio increased to about 102%.

Thus, even when the piezoelectric blower 1A2 according to the present modification is used, the effects described in Embodiment 1 can be obtained to a considerable extent.

Third Modification

Figure 9:
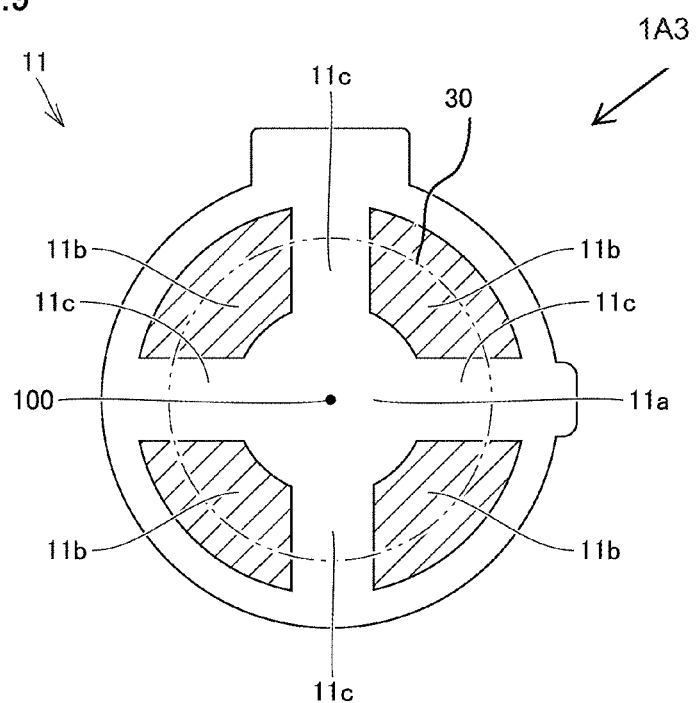
FIG. 9 is a bottom view of an upper case body of a piezoelectric blower according to a third modification.

FIG. 9 is a bottom view of an upper case body of a piezoelectric blower according to a third modification. Hereinafter, referring to FIG. 9, a piezoelectric blower 1A3 according to the present modification will be described.

The piezoelectric blower 1A3 according to the present modification is configured by including the upper case body 11 having a concave and convex shape different from that the piezoelectric blower 1A according to Embodiment 1 described above has, and thus, a configuration thereof differs from that of the piezoelectric blower 1A according to Embodiment 1 only in a shape of the upper gas chamber 80.

Specifically, as illustrated in FIG. 9, the upper case body 11 of the piezoelectric blower 1A3 according to the present modification includes the upper concave portion 11a having a circular shape in plan view, and the upper circumferential portion 11b having a protruding shape provided so as to surround the upper concave portion 11a, on a main surface positioned on a side close to the upper vibrating body 30. Groove portions 11c, each extending radially about the axis line 100, are provided on the upper circumferential portion 11b, and one end in an extending direction of each of the groove portions 11c is connected to the upper concave portion 11a. Note that, in FIG. 9, the upper circumferential portion 11b is hatched to facilitate understanding.

Here, part of the upper circumferential portion 11b other than a portion where the groove portion 11c is formed overlaps with an outer peripheral region including a peripheral portion of the upper vibrating body 30 in a direction parallel to an extending direction of the axis line 100. Thus, the upper narrow portion 82 defined by the portion of the upper circumferential portion 11b also overlaps with the outer peripheral region including the peripheral portion of the upper vibrating body 30 in the direction parallel to the extending direction of the axis line 100.

Also in the case of adopting this configuration, a side surface of the upper concave portion 11a defining the upper wide portion 81 functions as a reflection end of pressure propagation occurring in the upper gas chamber 80, so that a condition under which resonance occurs in the upper gas chamber 80 is canceled. Thus, it is possible to inhibit pressure fluctuation occurring in the upper gas chamber 80 facing the upper vibrating body 30 from acting to hinder displacement of the upper vibrating body 30, and as a result, it is possible to improve pump performance without necessarily increasing the size of a device.

Note that, in addition to the upper case body 11 described above, the concave and convex shape of this configuration may also be given to the lower case body 12, or may be given to only the lower case body 12 in place of the upper case body 11 described above.

Fourth Modification

Figure 10:
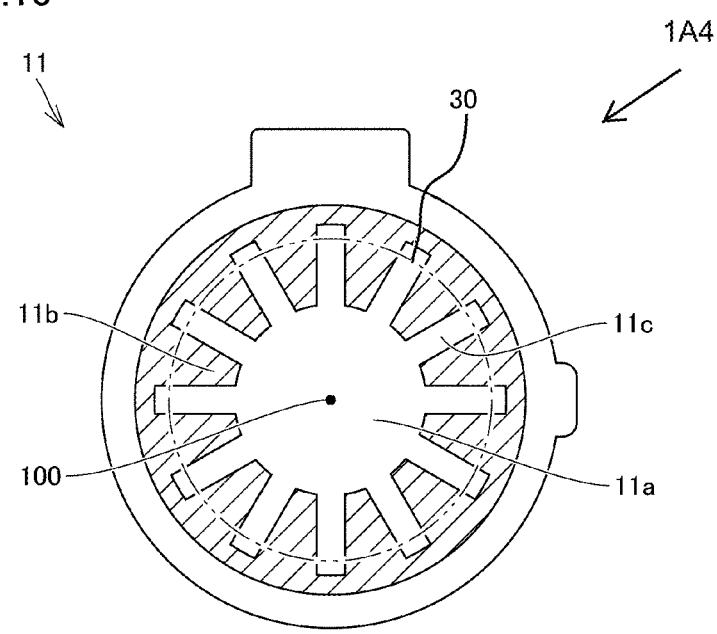
FIG. 10 is a bottom view of an upper case body of a piezoelectric blower according to a fourth modification.

FIG. 10 is a bottom view of an upper case body of a piezoelectric blower according to a fourth modification. Hereinafter, referring to FIG. 10, a piezoelectric blower 1A4 according to the present modification will be described.

The piezoelectric blower 1A4 according to the present modification is configured by including the upper case body 11 having a concave and convex shape different from that the piezoelectric blower 1A according to Embodiment 1 described above has, and thus, a configuration thereof differs from that of the piezoelectric blower 1A according to Embodiment 1 only in a shape of the upper gas chamber 80.

Specifically, as illustrated in FIG. 10, the upper case body 11 of the piezoelectric blower 1A4 according to the present modification includes the upper concave portion 11a having a circular shape in plan view, and the upper circumferential portion 11b having a protruding shape provided so as to surround the upper concave portion 11a on a main surface positioned on a side close to the upper vibrating body 30. Here, the groove portions 11c, which have a comb-like shape, each extending radially about the axis line 100, are provided on the upper circumferential portion 11b, and one end in an extending direction of each of the groove portions 11c is connected to the upper concave portion 11a, and another end is closed by the upper circumferential portion 11b. Note that, in FIG. 10, the upper circumferential portion 11b is hatched to facilitate understanding.

Here, part of the upper circumferential portion 11b other than a portion where the groove portion 11c is formed overlaps with an outer peripheral region including a peripheral portion of the upper vibrating body 30 in a direction parallel to an extending direction of the axis line 100. Thus, the upper narrow portion 82 defined by the portion of the upper circumferential portion 11b other than the portion where the groove portion 11c is formed also overlaps with the outer peripheral region including the peripheral portion of the upper vibrating body 30 in the direction parallel to the extending direction of the axis line 100.

Also in the case of adopting this configuration, a side surface of the upper concave portion 11a defining the upper wide portion 81 functions as a reflection end of pressure propagation occurring in the upper gas chamber 80, so that a condition under which resonance occurs in the upper gas chamber 80 is canceled. Thus, it is possible to inhibit pressure fluctuation occurring in the upper gas chamber 80 facing the upper vibrating body 30 from acting to hinder displacement of the upper vibrating body 30, and as a result, it is possible to improve pump performance without necessarily increasing the size of a device.

Note that, in addition to the upper case body 11 described above, the concave and convex shape of this configuration may also be given to the lower case body 12, or may be given to only the lower case body 12 in place of the upper case body 11 described above.

Fifth Modification

Figure 11:
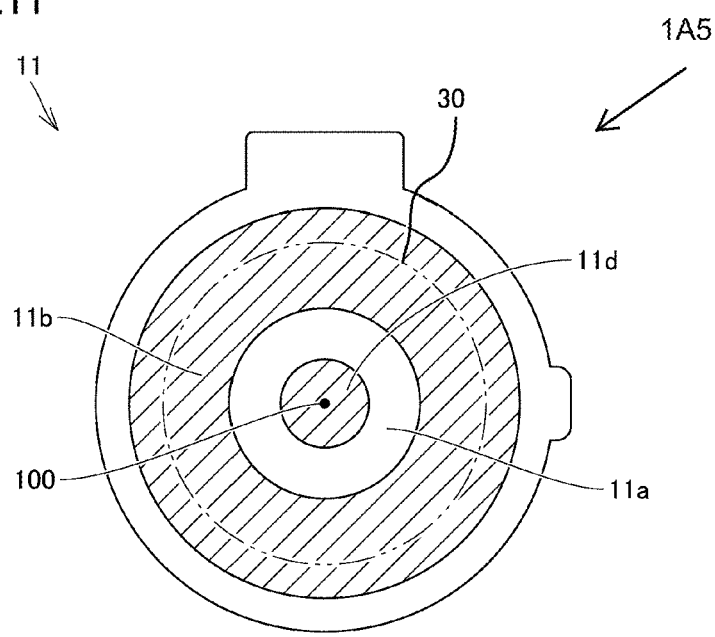
FIG. 11 is a bottom view of an upper case body of a piezoelectric blower according to a fifth modification.

FIG. 11 is a bottom view of an upper case body of a piezoelectric blower according to a fifth modification. Hereinafter, referring to FIG. 11, a piezoelectric blower 1A5 according to the present modification will be described.

The piezoelectric blower 1A5 according to the present modification is configured by including the upper case body 11 having a concave and convex shape different from that the piezoelectric blower 1A according to Embodiment 1 described above has, and thus, a configuration thereof differs from that of the piezoelectric blower 1A according to Embodiment 1 only in a shape of the upper gas chamber 80.

Specifically, as illustrated in FIG. 11, the upper case body 11 of the piezoelectric blower 1A5 according to the present modification includes the upper concave portion 11a having a circular shape in plan view, the upper circumferential portion 11b having a protruding shape provided so as to surround the upper concave portion 11a, and a protruding portion 11d provided inside the upper concave portion 11a, on a main surface positioned on a side close to the upper vibrating body 30. Note that, in FIG. 11, the upper circumferential portion 11b and the protruding portion 11d are hatched to facilitate understanding.

Here, part of the upper circumferential portion 11b overlaps with an outer peripheral region including a peripheral portion of the upper vibrating body 30 in a direction parallel to an extending direction of the axis line 100. Thus, the upper narrow portion 82 defined by the corresponding portion of the upper circumferential portion lib also overlaps with the outer peripheral region including the peripheral portion of the upper vibrating body 30 in the direction parallel to the extending direction of the axis line 100.

In the case of adopting this configuration, not only a side surface of the upper concave portion 11a defining the upper wide portion 81 functions as a reflection end of pressure propagation occurring in the upper gas chamber 80, but also a side surface of a protruding portion 11d provided inside the upper concave portion 11a functions as a reflection end of the pressure propagation occurring in the upper gas chamber 80, thus a condition under which resonance occurs in the upper gas chamber 80 is canceled. Thus, it is possible to inhibit pressure fluctuation occurring in the upper gas chamber 80 facing the upper vibrating body 30 from acting to hinder displacement of the upper vibrating body 30, and as a result, it is possible to improve pump performance without necessarily increasing the size of a device.

Note that, in addition to the upper case body 11 described above, the concave and convex shape of this configuration may also be given to the lower case body 12, or may be given to only the lower case body 12 in place of the upper case body 11 described above.

Sixth Modification

Figure 12:
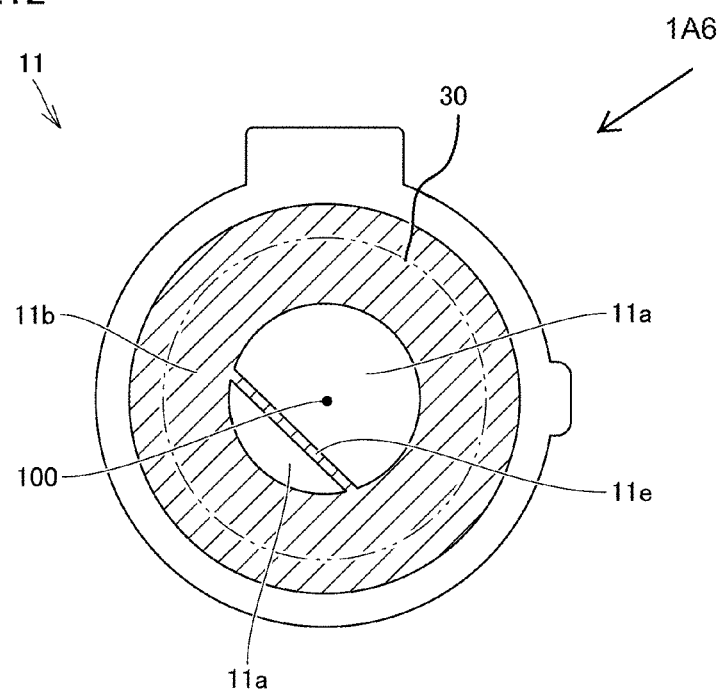
FIG. 12 is a bottom view of an upper case body of a piezoelectric blower according to a sixth modification.

FIG. 12 is a bottom view of an upper case body of a piezoelectric blower according to a sixth modification. Hereinafter, referring to FIG. 12, a piezoelectric blower 1A6 according to the present modification will be described.

The piezoelectric blower 1A6 according to the present modification is configured by including the upper case body 11 having a concave and convex shape different from that the piezoelectric blower 1A according to Embodiment 1 described above has, and thus, a configuration thereof differs from that of the piezoelectric blower 1A according to Embodiment 1 only in a shape of the upper gas chamber 80.

Specifically, as illustrated in FIG. 12, the upper case body 11 of the piezoelectric blower 1A6 according to the present modification includes the upper concave portion 11a having a circular shape in plan view, the upper circumferential portion 11b having a protruding shape provided so as to surround the upper concave portion 11a, and a partition portion 11e provided inside the upper concave portion 11a, on a main surface positioned on a side close to the upper vibrating body 30. The partition portion 11e is provided such that predetermined positions on an inner peripheral surface of the upper circumferential portion 11b are bridged, thereby partitioning a space inside the upper concave portion 11a. Note that, in FIG. 12, the upper circumferential portion lib and the partition portion 11e are hatched in order to facilitate understanding.

Here, part of the upper circumferential portion 11b overlaps with an outer peripheral region including a peripheral portion of the upper vibrating body 30 in a direction parallel to an extending direction of the axis line 100. Thus, the upper narrow portion 82 defined by the corresponding portion of the upper circumferential portion lib also overlaps with the outer peripheral region including the peripheral portion of the upper vibrating body 30 in the direction parallel to the extending direction of the axis line 100.

In the case of adopting this configuration, not only a side surface of the upper concave portion 11a defining the upper wide portion 81 functions as a reflection end of pressure propagation occurring in the upper gas chamber 80, but also a side surface of the partition portion 11e provided inside the upper concave portion 11a functions as a reflection end of the pressure propagation occurring in the upper gas chamber 80, thus a condition under which resonance occurs in the upper gas chamber 80 is canceled. Thus, it is possible to inhibit pressure fluctuation occurring in the upper gas chamber 80 facing the upper vibrating body 30 from acting to hinder displacement of the upper vibrating body 30, and as a result, it is possible to improve pump performance without necessarily increasing the size of a device.

Note that, in addition to the upper case body 11 described above, the concave and convex shape of this configuration may also be given to the lower case body 12, or may be given to only the lower case body 12 in place of the upper case body 11 described above.

Seventh Modification

Figure 13:
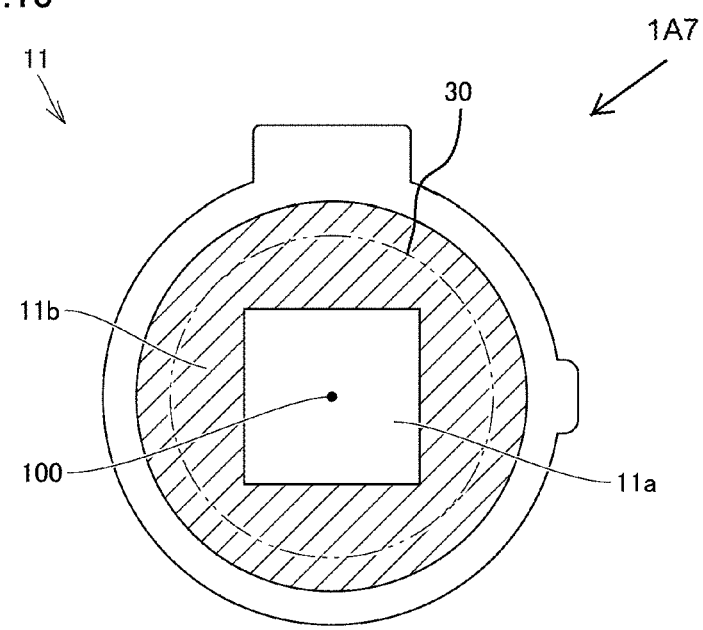
FIG. 13 is a bottom view of an upper case body of a piezoelectric blower according to a seventh modification.

FIG. 13 is a bottom view of an upper case body of a piezoelectric blower according to a seventh modification. Hereinafter, referring to FIG. 13, a piezoelectric blower 1A7 according to the present modification will be described.

The piezoelectric blower 1A7 according to the present modification is configured by including the upper case body 11 having a concave and convex shape different from that the piezoelectric blower 1A according to Embodiment 1 described above has, and thus, a configuration thereof differs from that of the piezoelectric blower 1A according to Embodiment 1 only in a shape of the upper gas chamber 80.

Specifically, as illustrated in FIG. 13, the upper case body 11 of the piezoelectric blower 1A7 according to the present modification includes the upper concave portion 11a having a rectangular shape in plan view, and the upper circumferential portion 11b having a protruding shape provided so as to surround the upper concave portion 11a, on a main surface positioned on a side close to the upper vibrating body 30. Note that, in FIG. 13, the upper circumferential portion 11b is hatched to facilitate understanding.

Here, part of the upper circumferential portion 11b overlaps with an outer peripheral region including a peripheral portion of the upper vibrating body 30 in a direction parallel to an extending direction of the axis line 100. Thus, the upper narrow portion 82 defined by the corresponding portion of the upper circumferential portion 11b also overlaps with the outer peripheral region including the peripheral portion of the upper vibrating body 30 in the direction parallel to the extending direction of the axis line 100.

Also in the case of adopting this configuration, a side surface of the upper concave portion 11a defining the upper wide portion 81 functions as a reflection end of pressure propagation occurring in the upper gas chamber 80, so that a condition under which resonance occurs in the upper gas chamber 80 is canceled. Furthermore, since the upper concave portion 11a has a non-circular shape in plan view, axial symmetry (so-called continuous symmetry) of the upper gas chamber 80 reduces, thereby making it easier to cancel a condition under which resonance occurs. Thus, it is possible to inhibit pressure fluctuation occurring in the upper gas chamber 80 facing the upper vibrating body 30 from acting to hinder displacement of the upper vibrating body 30, and as a result, it is possible to improve pump performance without necessarily increasing the size of a device.

Note that, in addition to the upper case body 11 described above, the concave and convex shape of this configuration may also be given to the lower case body 12, or may be given to only the lower case body 12 in place of the upper case body 11 described above. Further, the shape of the concave portion is not limited to the rectangular shape described above, and may be changed to a polygonal shape other than a rectangular shape, to an elliptical shape, or the like.

Embodiment 2

Figure 14:
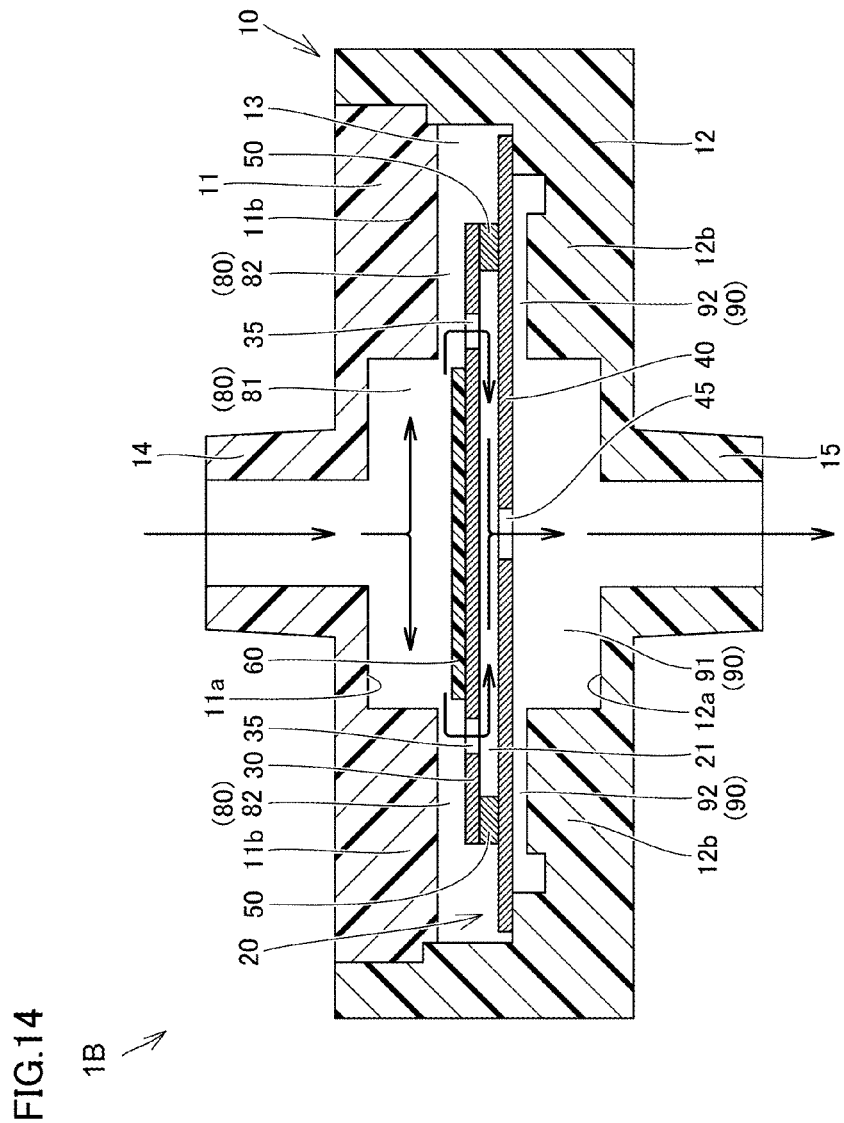
FIG. 14 is a schematic diagram illustrating a configuration of a piezoelectric blower according to Embodiment 2 and an approximate direction of a gas flow occurring during operation.

FIG. 14 is a schematic diagram illustrating a configuration of a piezoelectric blower according to Embodiment 2 of the disclosure and an approximate direction of a gas flow occurring during operation. Hereinafter, referring to FIG. 14, a piezoelectric blower 1B according to the present embodiment will be described.

As illustrated in FIG. 14, the piezoelectric blower 1B according to the present embodiment mainly includes the housing 10 and the driving unit 20 as in the piezoelectric blower 1A according to Embodiment 1 described above, and a configuration thereof differs from that of the piezoelectric blower 1A according to the above-described Embodiment 1 only in a shape of the housing 10.

Specifically, the housing 10 of the piezoelectric blower 1B includes the upper case body 11 and the lower case body 12, and the upper nozzle portion 14 as a first communication portion is provided in the upper case body 11 so as to protrude outward from a central portion thereof, and the lower nozzle portion 15 as a second communication portion is provided in the lower case body 12 so as to protrude outward from a central portion thereof.

Thus, both the upper nozzle portion 14 and the lower nozzle portion 15 are disposed so as to overlap with the driving unit 20 in a direction parallel to an extending direction of the axis line 100 (not illustrated in FIG. 14), the upper nozzle portion 14 communicates with the upper wide portion 81 mainly defined by the upper concave portion 11a provided in the upper case body 11, and the lower nozzle portion 15 communicates with the lower wide portion 91 mainly defined by the lower concave portion 12a provided in the lower case body 12.

Also in the case of adopting this configuration, a side surface of the upper concave portion 11a defining the upper wide portion 81 functions as a reflection end of pressure propagation occurring in the upper gas chamber 80, and a side surface of the lower concave portion 12a defining the lower wide portion 91 functions as a reflection end of pressure propagation occurring in the lower gas chamber 90, thus a condition under which resonance occurs is canceled in both the upper gas chamber 80 and the lower gas chamber 90.

Thus, in the case in which the above configuration is adopted, when compared with the piezoelectric blower 1A according to Embodiment 1 described above, a device is not sufficiently thinned, but as a result, pump performance can be improved.

Note that, when this configuration is adopted, since the upper narrow portion 82 is configured so as to overlap with part of the upper vibrating body 30 (that is, an outer peripheral region of the upper vibrating body 30) in a direction parallel to an extending direction of the axis line 100, and also, the upper hole portions 35 are provided so as to face the upper narrow portion 82, the upper nozzle portion 14 and the pump chamber 21 are configured to communicate with each other with the upper narrow portion 82 interposed therebetween. Thus, since the upper narrow portion 82 functions as a kind of orifice for making the pump chamber 21 less susceptible to influence from an outside of the piezoelectric blower 1A, the driving unit 20 stably operates, and pump performance can be improved in this regard as well.

Embodiment 3

Figure 15A:
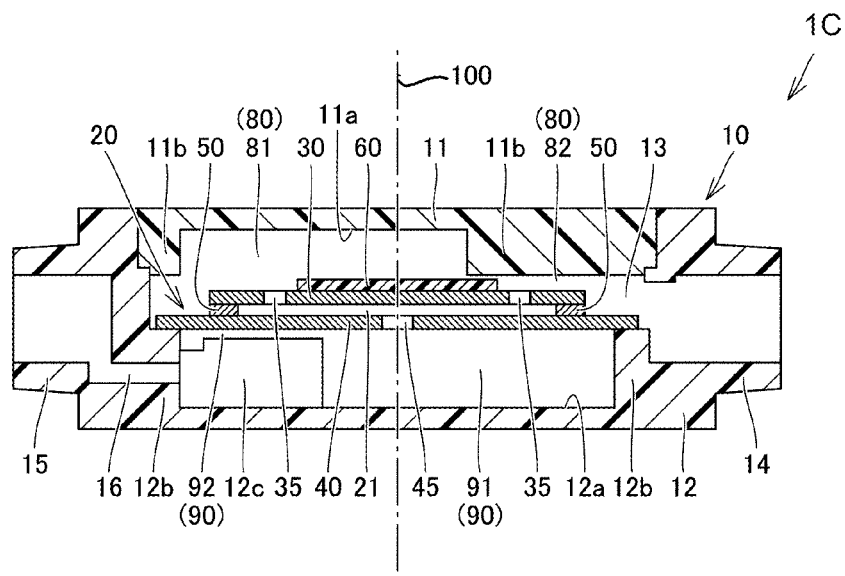
FIGS. 15A and 15B are schematic diagrams illustrating a configuration of a piezoelectric blower according to Embodiment 3 and a bottom view of an upper case body provided in the piezoelectric blower.
Figure 15B:
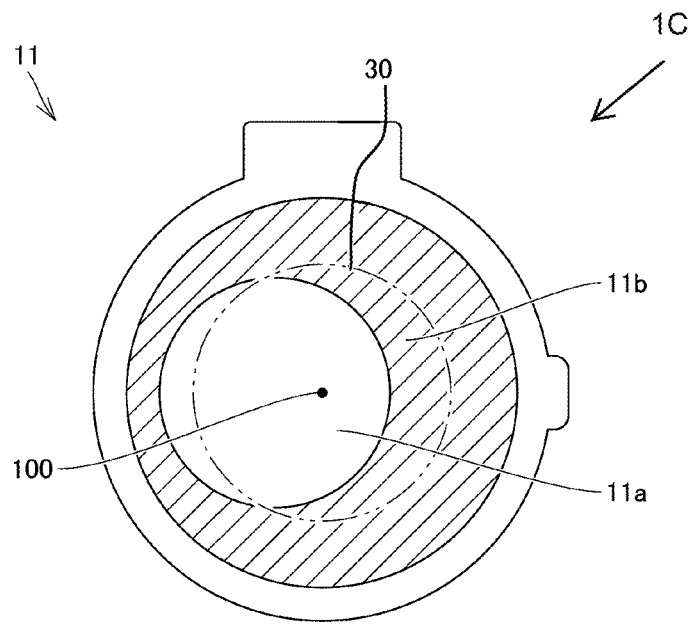

FIGS. 15A and 15B are schematic diagrams illustrating a configuration of a piezoelectric blower according to Embodiment 3 of the present disclosure and a bottom view of an upper case body provided in the piezoelectric blower. Hereinafter, referring to FIGS. 15A and 15B, a piezoelectric blower 1C according to the present embodiment will be described.

As illustrated in FIG. 15A, the piezoelectric blower 1C according to the present embodiment mainly includes the housing 10 and the driving unit 20 as in the piezoelectric blower 1A according to Embodiment 1 described above, and a configuration thereof differs from that of the piezoelectric blower 1A according to the above-described Embodiment 1 only in a shape of the housing 10.

Specifically, as illustrated in FIG. 15A and FIG. 15B, in the piezoelectric blower 1C according to the present embodiment, although the upper concave portion 11a having a circular shape in plan view is provided so as to be opposed to a portion including a central portion of the upper vibrating body 30, the upper concave portion 11a is eccentrically disposed so that a central axis of the upper concave portion 11a does not coincide with the axis line 100 orthogonal to a central portion of the upper vibrating body 30 and a central portion of the lower vibrating body 40. Thus, the upper wide portion 81 mainly defined by the upper concave portion 11a is also eccentrically positioned. Note that, in FIG. 15B, the upper circumferential portion 11b is hatched to facilitate understanding.

Here, part of the upper circumferential portion 11b overlaps with part of an outer peripheral region including a peripheral portion of the upper vibrating body 30 in a direction parallel to the extending direction of the axis line 100. Thus, the upper narrow portion 82 to be defined by the corresponding portion of the upper circumferential portion 11b also overlaps with the part of the outer peripheral region including the peripheral portion of the upper vibrating body 30 in the direction parallel to the extending direction of the axis line 100.

Additionally, as illustrated in FIG. 15A, in the piezoelectric blower 1C according to the present embodiment, although the lower concave portion 12a having a circular shape in plan view is provided so as to be opposed to a portion including a central portion of the lower vibrating body 40, the lower concave portion 12a is eccentrically disposed so that a central axis of the lower concave portion 12a does not coincide with the axis line 100 orthogonal to the central portion of the upper vibrating body 30 and the central portion of the lower vibrating body 40. Thus, the lower wide portion 91 mainly defined by the lower concave portion 12a, is also eccentrically positioned.

Here, part of the lower circumferential portion 12b overlaps with part of an outer peripheral region including a peripheral portion of the lower vibrating body 40 in the direction parallel to the extending direction of the axis line 100. Thus, the lower narrow portion 92 to be defined by this portion of the lower circumferential portion 12b also overlaps with the part of the outer peripheral region including the peripheral portion of the lower vibrating body 40 in the direction parallel to the extending direction of the axis line 100.

Also in the case of adopting this configuration, a side surface of the upper concave portion 11a defining the upper wide portion 81 functions as a reflection end of pressure propagation occurring in the upper gas chamber 80, and a side surface of the lower concave portion 12a defining the lower wide portion 91 functions as a reflection end of pressure propagation occurring in the lower gas chamber 90, thus a condition under which resonance occurs is canceled in both the upper gas chamber 80 and the lower gas chamber 90.

Thus, when the above configuration is adopted as well, pump performance can be improved without necessarily increasing the size of a device.

(Reference Mode 1)

Figure 16A:
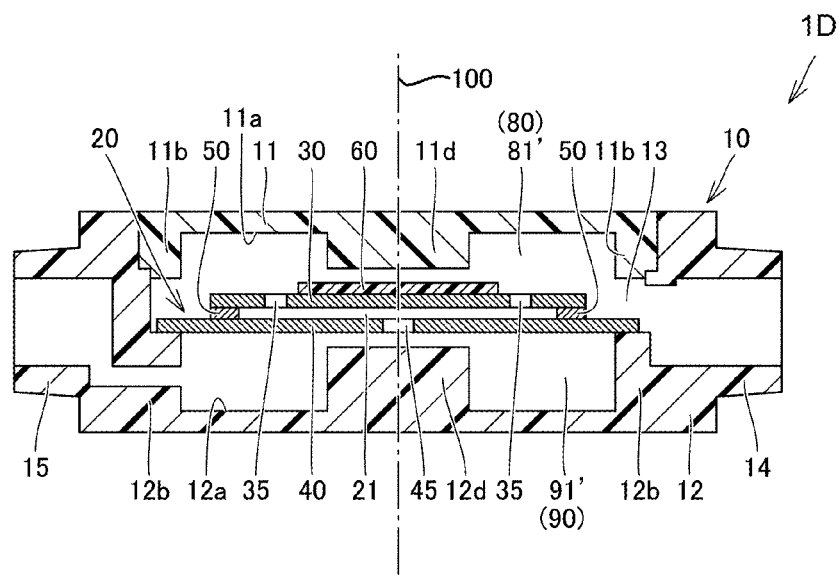
FIGS. 16A and 16B are schematic diagrams illustrating a configuration of a piezoelectric blower according to Reference mode 1 and a bottom view of an upper case body provided in the piezoelectric blower.
Figure 16B:
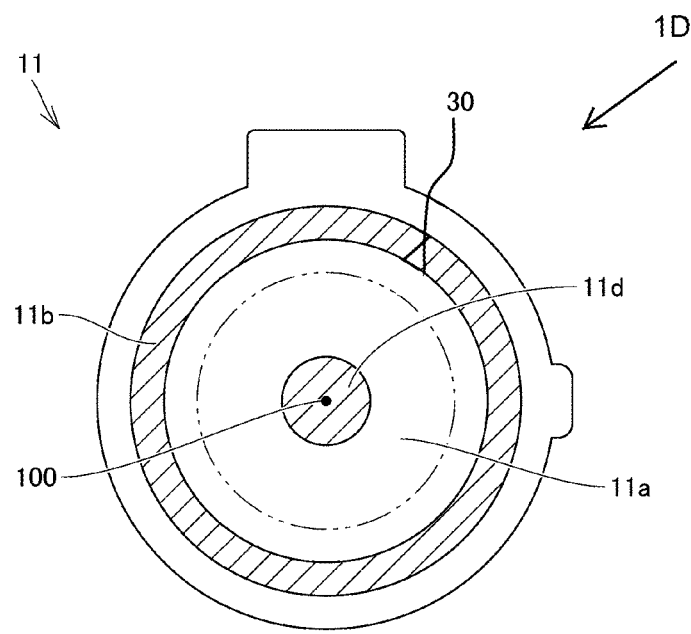

FIGS. 16A and 16B are schematic diagrams illustrating a configuration of a piezoelectric blower according to Reference mode 1 and a bottom view of an upper case body provided in the piezoelectric blower. Hereinafter, referring to FIGS. 16A and 16B, a piezoelectric blower 1D according to the present reference mode will be described.

As illustrated in FIG. 16A, the piezoelectric blower 1D according to the present reference mode mainly includes the housing 10 and the driving unit 20 as in the piezoelectric blower 1A according to Embodiment 1 described above, and a configuration thereof differs from that of the piezoelectric blower 1A according to the above-described Embodiment 1 only in a shape of the housing 10.

Specifically, as illustrated in FIG. 16A and FIG. 16B, in the piezoelectric blower 1D according to the present reference mode, the upper case body 11 includes the upper concave portion 11a having a circular shape in plan view, the upper circumferential portion 11b having a protruding shape provided so as to surround the upper concave portion 11a, and the protruding portion 11d provided inside the upper concave portion 11a. Note that, in FIG. 16B, the upper circumferential portion 11b and the protruding portion 11d are hatched to facilitate understanding.

Here, the upper circumferential portion 11b does not overlap with the upper vibrating body 30 in a direction parallel to an extending direction of the axis line 100, and thus, the piezoelectric blower 1D according to the present reference mode does not substantially include the upper narrow portion 82 included in the piezoelectric blower 1A according to Embodiment 1, and includes only the upper wide portion 81' having a diameter larger than that of the upper vibrating body 30.

Additionally, as illustrated in FIG. 16A, in the piezoelectric blower 1D according to the present reference mode, the lower case body 12 includes the lower concave portion 12a having a circular shape in plan view, the lower circumferential portion 12b having a protruding shape provided so as to surround the lower concave portion 12a, and the protruding portion 12d provided inside the lower concave portion 12a.

Here, the lower circumferential portion 12b does not overlap with the upper vibrating body 30 in the direction parallel to the extending direction of the axis line 100, and thus, the piezoelectric blower 1D according to the present reference mode does not substantially include the lower narrow portion 92 included in the piezoelectric blower 1A according to Embodiment 1, and includes only the lower wide portion 91' having a diameter larger than that of the lower vibrating body 40.

However, when this configuration is adopted, also, a side surface of the protruding portion 11d provided inside the upper concave portion 11a functions as a reflection end of pressure propagation occurring in the upper gas chamber 80, and a side surface of the protruding portion 12d provided inside the lower concave portion 12a functions as a reflection end of pressure propagation occurring in the lower gas chamber 90, thus a condition under which resonance occurs is canceled in the upper gas chamber 80 and the lower gas chamber 90.

Thus, by adopting this configuration, it is possible to inhibit pressure fluctuation occurring in the upper gas chamber 80 and the lower gas chamber 90 from acting to hinder displacement of the upper vibrating body 30 and the lower vibrating body 40 respectively to a considerable extent, and as a result, it is possible to improve pump performance without necessarily increasing the size of a device.

(Reference Mode 2)

Figure 17:
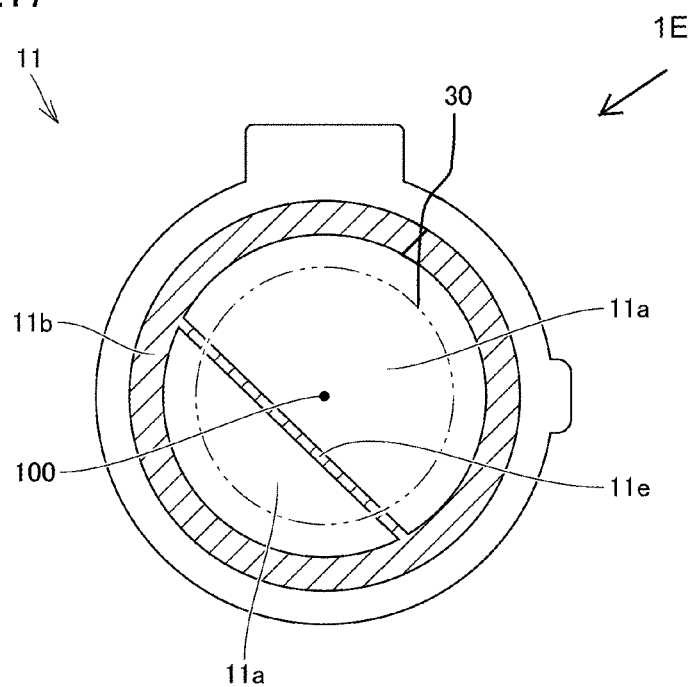
FIG. 17 is a bottom view of an upper case body of a piezoelectric blower according to Reference mode 2.

FIG. 17 is a bottom view of an upper case body of a piezoelectric blower according to Reference mode 2. Hereinafter, referring to FIG. 17, a piezoelectric blower 1E according to the present reference mode will be described.

The piezoelectric blower 1E according to the present reference mode is configured by including the upper case body 11 having a concave and convex shape different from that the piezoelectric blower 1D according to Reference mode 1 described above has, and thus, a configuration thereof differs from that of the piezoelectric blower 1D according to Reference mode 1 only in a shape of an upper gas chamber.

Specifically, as illustrated in FIG. 17, the upper case body 11 of the piezoelectric blower 1E according to the present reference mode includes the upper concave portion 11a having a circular shape in plan view, the upper circumferential portion 11b having a protruding shape provided so as to surround the upper concave portion 11a, and a partition portion 11e provided inside the upper concave portion 11a, on a main surface positioned on a side close to the upper vibrating body 30. The partition portion 11e is provided such that predetermined positions on an inner peripheral surface of the upper circumferential portion 11b are bridged, thereby partitioning a space inside the upper concave portion 11a. Note that, in FIG. 17, the upper circumferential portion lib and the partition portion 11e are hatched in order to facilitate understanding.

Here, the upper circumferential portion 11b does not overlap with the upper vibrating body 30 in a direction parallel to an extending direction of the axis line 100, and thus, the piezoelectric blower 1E according to the present reference mode does not substantially include the upper narrow portion 82 included in the piezoelectric blower 1A according to Embodiment 1, and includes only an upper wide portion having a diameter larger than that of the upper vibrating body 30.

However, when this configuration is adopted, also, since a side surface of the partition portion 11e provided in the upper concave portion 11a functions as a reflection end of pressure propagation occurring in the upper gas chamber, a condition under which resonance occurs in the upper gas chamber is canceled.

Thus, by adopting this configuration, it is possible to inhibit pressure fluctuation occurring in the upper gas chamber from acting to hinder displacement of the upper vibrating body 30 to a considerable extent, and as a result, it is possible to improve pump performance without necessarily increasing the size of a device.

Note that, in addition to the upper case body 11 described above, the concave and convex shape of this configuration may also be given to the lower case body 12, or may be given to only the lower case body 12 in place of the upper case body 11 described above.

(Reference Mode 3)

Figure 18:
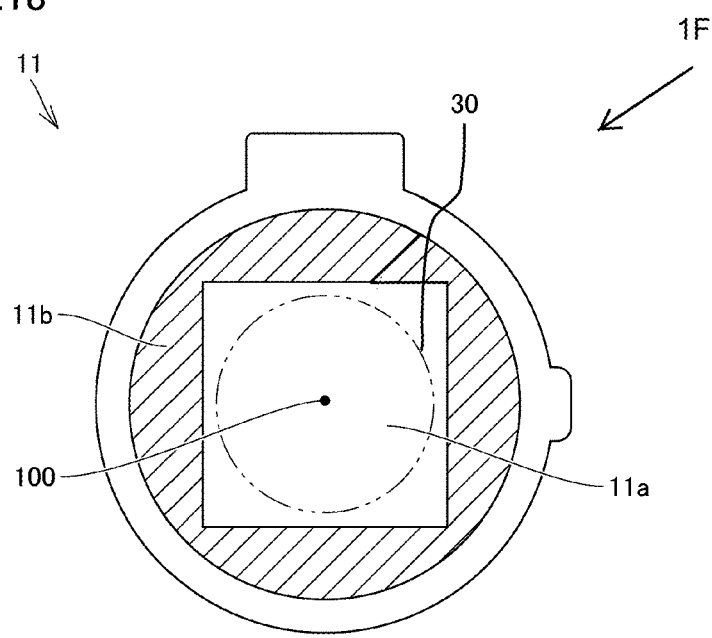
FIG. 18 is a bottom view of an upper case body of a piezoelectric blower according to Reference mode 3.

FIG. 18 is a bottom view of an upper case body of a piezoelectric blower according to Reference mode 3. Hereinafter, referring to FIG. 18, a piezoelectric blower 1F according to the present reference mode will be described.

The piezoelectric blower 1F according to the present reference mode is configured by including the upper case body 11 having a concave and convex shape different from that the piezoelectric blower 1D according to Reference mode 1 described above has, and thus, a configuration thereof differs from that of the piezoelectric blower 1D according to Reference mode 1 described above only in a shape of an upper gas chamber.

Specifically, as illustrated in FIG. 18, the upper case body 11 of the piezoelectric blower 1F according to the present reference mode includes the upper concave portion 11a having a rectangular shape in plan view, and the upper circumferential portion 11b having a protruding shape provided so as to surround the upper concave portion 11a, on a main surface positioned on a side close to the upper vibrating body 30. Note that, in FIG. 18, the upper circumferential portion 11b is hatched to facilitate understanding.

Here, the upper circumferential portion 11b does not overlap with the upper vibrating body 30 in a direction parallel to an extending direction of the axis line 100, and thus, the piezoelectric blower 1F according to the present reference mode does not substantially include the upper narrow portion 82 included in the piezoelectric blower 1A according to Embodiment 1, and includes only an upper wide portion having a diameter larger than that of the upper vibrating body 30.

However, when this configuration is adopted, also, since the upper concave portion 11a has a non-circular shape in plan view, axial symmetry (so-called continuous symmetry) of the upper gas chamber reduces, thereby making it easier to cancel a condition under which resonance occurs.

Thus, by adopting this configuration, it is possible to inhibit pressure fluctuation occurring in the upper gas chamber from acting to hinder displacement of the upper vibrating body 30 to a considerable extent, and as a result, it is possible to improve pump performance without necessarily increasing the size of a device.

Note that, in addition to the upper case body 11 described above, the concave and convex shape of this configuration may also be given to the lower case body 12, or may be given to only the lower case body 12 in place of the upper case body 11 described above.

Others

In Embodiments 1 to 3 and the modifications thereof according to the present disclosure described above, the descriptions have been given by illustrating the cases in each of which the first hole portions provided in the first vibrating body are disposed in sequence in the annular shape, but the first hole portions need not be disposed in sequence in an annular shape, and the layout thereof can be changed as appropriate. Similarly, as for the second hole portions provided in the second vibrating body, the layout thereof can also be changed as appropriate.

In addition, in Embodiments 1 to 3 and the modifications thereof according to the present disclosure described above, the descriptions have been given by illustrating the configuration in which the check valve is attached to the second hole portion provided in the second vibrating body, but a check valve may be attached to the first hole portion provided in the first vibrating body instead of the second hole portion, or a check valve may be provided for both the first hole portion and the second hole portion. Furthermore, a flow direction of gas allowed and limited by a check valve can also be changed as appropriate.

In addition, in Embodiments 1 to 3 and the modifications thereof according to the present disclosure described above, the descriptions have been given by illustrating the case in which the first wide portion and the second wide portion are each formed of the cylindrical space or a prismatic space, but the wide portion may be formed of a conical or pyramidal space, or the like.

Further, the characteristic configurations illustrated in Embodiments 1 to 3 and the modifications thereof according to the present disclosure described above may be appropriately combined without necessarily departing from the spirit and scope of the present disclosure.

Further, in Embodiments 1 to 3 and the modifications thereof according to the present disclosure described above, although the descriptions have been given by illustrating the case in which the present disclosure is applied to the piezoelectric blower that pulls in and discharges gas, the present disclosure can also be applied to a pump that pulls and discharges liquid, and a pump that utilizes one other than a piezoelectric element as a driving body (however, of course, limited to a positive-displacement pump utilizing flexural vibration of a vibrating body).

Here, the piezoelectric blowers illustrated in Embodiments 1 to 3 and the modifications thereof according to the present disclosure described above are particularly suitable for use as blowers incorporated in various devices usable for medical applications, and examples of these devices include a nasal mucus suction device, a milking machine, a negative-pressure wound therapy device, and the like.

As describe above, the embodiments and the modifications disclosed in the description are illustrative in all respects and are not intended to limit the scope of the present disclosure. The technical scope of the present disclosure is defined by the appended claims, and includes all modifications within the meaning and scope equivalent to the description of the appended claims.

REFERENCE SIGNS LIST 1A to 1F, 1A1 to 1A7 PIEZOELECTRIC BLOWERS, 10 HOUSING, 11 UPPER CASE BODY, 11a UPPER CONCAVE PORTION, 11b UPPER CIRCUMFERENTIAL PORTION, 11b1 TERMINAL INSERTION PORTION, 11c GROOVE PORTION, 11d PROTRUDING PORTION, 11e PARTITION PORTION, LOWER CASE BODY, 12a LOWER CONCAVE PORTION, 12b LOWER CIRCUMFERENTIAL PORTION, 12c GROOVE PORTION, 12d PROTRUDING PORTION, 13 HOUSING SPACE, 14 UPPER NOZZLE PORTION, 15 LOWER NOZZLE PORTION, 16 FLOW PATH PORTION, 17 TERMINAL SUPPORT, 20 DRIVING UNIT, 21 PUMP CHAMBER, 30 UPPER VIBRATING BODY, 31 UPPER VIBRATING PLATE, 31a HOLE PORTION, 35 UPPER HOLE PORTION, LOWER VIBRATING BODY, 41 LOWER VIBRATING PLATE, 41a HOLE PORTION, 42 AUXILIARY VIBRATING PLATE, 42a HOLE PORTION, 43 CHECK VALVE, 43a HOLE PORTION, 44 VALVE BODY HOLDING MEMBER, 44a HOLE PORTION, 44b SECOND TERMINAL, 45 LOWER HOLE PORTION, SPACER, 60 PIEZOELECTRIC ELEMENT, 70 FIRST TERMINAL, 80 UPPER GAS CHAMBER, 81, 81' UPPER WIDE PORTION, 82 UPPER NARROW PORTION, 90 LOWER GAS CHAMBER, 91, 91' LOWER WIDE PORTION, 92 LOWER NARROW PORTION, 100 AXIS LINE

The invention claimed is:

1. A pump, comprising:
a first vibrating body that has a plate shape;
a second vibrating body that has a plate shape and is opposed to the first vibrating body;
a peripheral wall portion connecting a peripheral portion of the first vibrating body with a peripheral portion of the second vibrating body;
a pump chamber positioned between the first vibrating body and the second vibrating body and defined by the first vibrating body, the second vibrating body, and the peripheral wall portion;
a driving body causing the first vibrating body and the second vibrating body to bend and vibrate to generate pressure fluctuation in the pump chamber; and
a housing that houses a driving unit composed of the first vibrating body, the second vibrating body, the peripheral wall portion, and the driving body, wherein
the housing includes a first wall portion positioned on a side opposite to a side where the second vibrating body is positioned when viewed from the first vibrating body, and a second wall portion positioned on a side opposite to a side where the first vibrating body is positioned when viewed from the second vibrating body,
the driving unit is disposed so as to divide a space inside the housing into a first chamber defined by the first vibrating body and the first wall portion, and a second chamber defined by the second vibrating body and the second wall portion,
the housing is provided with a first communication portion that communicates the first chamber with a space outside the housing, and a second communication portion that communicates the second chamber with a space outside the housing,
the first vibrating body is provided with a first hole portion that communicates the pump chamber with the first chamber,
the second vibrating body is provided with a second hole portion that communicates the pump chamber with the second chamber,
the first wall portion includes a first concave portion that opens toward the first vibrating body and that is opposed to a portion, including a central portion, of the first vibrating body, and a first circumferential portion that is annular and is adjacent to the first concave portion in a direction orthogonal to an axis line,
the first chamber includes a first wide portion defined by the first concave portion and a portion of the first vibrating body opposed to the first concave portion, and a first narrow portion defined by the first circumferential portion and a portion of the first vibrating body opposed to the first circumferential portion, and
the first narrow portion overlaps with at least part of the first vibrating body when viewed in a direction parallel to an extending direction of the axis line.

2. The pump according to claim 1, wherein
the first vibrating body is disc-shaped, and
the first wide portion comprises a cylindrical space.

3. The pump according to claim 2, wherein
the first wide portion is positioned such that a central axis of the first wide portion coincides with the axis line.

4. The pump according to claim 2, wherein
the first hole portion comprises two or more first hole portions, each communicating the pump chamber with the first chamber, are provided, and
the two or more first hole portions are, when viewed along the extending direction of the axis line, disposed in sequence at positions on circumference about the axis line.

5. The pump according to claim 2, wherein a condition of $0.4 \leq Rb1/Ra1 < 1.0$ is satisfied, where Ra1 is a diameter of the first vibrating body and Rb1 is a diameter of the first wide portion.

6. The pump according to claim 5, wherein
the first wide portion is positioned such that a central axis of the first wide portion coincides with the axis line.

7. The pump according to claim 5, wherein
two or more first hole portions, each of which is the first hole portion that communicates the pump chamber with the first chamber, are provided, and
the two or more first hole portions are, when viewed along the extending direction of the axis line, disposed in sequence at positions on circumference about the axis line.

8. The pump according to claim 1, wherein the first hole portion comprises two or more first hole portions, each communicating the pump chamber with the first chamber, are provided, and
the two or more first hole portions are, when viewed along the extending direction of the axis line, disposed in sequence at positions on circumference about the axis line.

9. The pump according to claim 8, wherein
the two or more first hole portions are disposed so as to be opposed to the first circumferential portion.

10. The pump according to claim 1, wherein
the first communication portion is disposed at a position that does not overlap with the first vibrating body when viewed in the direction parallel to the extending direction of the axis line.

11. The pump according to claim 1, wherein the second wall portion includes a second concave portion that opens toward the second vibrating body and that is opposed to a portion, including the central portion, of the second vibrating body, and a second circumferential portion adjacent to the second concave portion in a direction orthogonal to the axis line,
the second chamber includes a second wide portion defined by the second concave portion and a portion of the second vibrating body opposed to the second concave portion, and a second narrow portion defined by the second circumferential portion and a portion of the second vibrating body opposed to the second circumferential portion, and the second narrow portion overlaps with at least part of the second vibrating body when viewed in the direction parallel to the extending direction of the axis line.

12. The pump according to claim 11, wherein
the second vibrating body is disc-shaped, and
the second wide portion comprises a cylindrical space.

13. The pump according to claim 12, wherein
a condition of $0.4 \leq Rb2/Ra2 < 1.0$ is satisfied, where Ra2 is a diameter of the second vibrating body and Rb2 is a diameter of the second wide portion.

14. The pump according to claim 12, wherein
the second wide portion is positioned such that a central axis of the second wide portion coincides with the axis line.

15. The pump according to claim 11, wherein
one or more second hole portions, each of which is the second hole portion that communicates the pump chamber with the second chamber, are provided, and
the one or more second hole portions are disposed at or close to the central portion of the second vibrating body.

16. The pump according to claim 11, further comprising
an orifice that is provided at a position not overlapping with the second vibrating body when viewed in the direction parallel to the extending direction of the axis line and that forms at least part of a flow path that communicates the second wide portion with the second communicating portion, wherein
the second wide portion is configured to communicate with the second communication portion only through the orifice.

17. The pump according to claim 11, wherein
the second communication portion is disposed at a position that does not overlap with the second vibrating body when viewed in the direction parallel to the extending direction of the axis line.

18. The pump according to claim 1, wherein
the driving body causes the first vibrating body and the second vibrating body to bend and vibrate such that standing waves occur in both the first vibrating body and the second vibrating body about the axis line.

19. The pump according to claim 1, wherein
the first communication portion functions as a suction portion that pulls in fluid from a space outside the housing to the first chamber, and
the second communication portion is a discharge portion that discharges fluid from the second chamber to a space outside the housing.

20. The pump according to claim 1, wherein
the driving body includes a piezoelectric element in a flat shape attached to one of the first vibrating body and the second vibrating body.

* * * * *